(12) United States Patent
Sun et al.

(10) Patent No.: US 9,793,474 B2
(45) Date of Patent: Oct. 17, 2017

(54) LOW TEMPERATURE P+ POLYCRYSTALLINE SILICON MATERIAL FOR NON-VOLATILE MEMORY DEVICE

(71) Applicant: Crossbar, Inc., Santa Clara, CA (US)

(72) Inventors: Xin Sun, Albany, CA (US); Sung Hyun Jo, Sunnyvale, CA (US); Tanmay Kumar, Pleasanton, CA (US)

(73) Assignee: CROSSBAR, INC., Santa Clara, CA (US)

(*) Notice: Subject to any disclaimer, the term of this patent is extended or adjusted under 35 U.S.C. 154(b) by 0 days.

(21) Appl. No.: 14/188,622

(22) Filed: Feb. 24, 2014

(65) Prior Publication Data
US 2014/0191180 A1     Jul. 10, 2014

Related U.S. Application Data

(62) Division of application No. 13/452,657, filed on Apr. 20, 2012, now Pat. No. 8,658,476.

(51) Int. Cl.
*H01L 21/02*     (2006.01)
*H01L 21/20*     (2006.01)
(Continued)

(52) U.S. Cl.
CPC .......... *H01L 45/145* (2013.01); *H01L 27/101* (2013.01); *H01L 27/2463* (2013.01);
(Continued)

(58) Field of Classification Search
CPC . H01L 45/145; H01L 45/1616; H01L 45/146; H01L 27/2463; H01L 45/1233; H01L 45/085
(Continued)

(56) References Cited

U.S. PATENT DOCUMENTS

| 680,652 A | 8/1901 | Leonard |
|---|---|---|
| 4,433,468 A | 2/1984 | Kawamata |

(Continued)

FOREIGN PATENT DOCUMENTS

| CN | 101131872 A | 2/2008 |
|---|---|---|
| CN | 101170132 A | 4/2008 |

(Continued)

OTHER PUBLICATIONS

Jian Hu et al., "Area-Dependent Switching in Thin Film-Silicon Devices", Materials Research Society Proceedings, 2003, pp. A18.3.1-A18.3.6, vol. 762, No. 1, Cambridge University Press.

(Continued)

*Primary Examiner* — Long K Tran
*Assistant Examiner* — Thai T Vuong
(74) *Attorney, Agent, or Firm* — Amin, Turocy & Watson, LLP

(57) ABSTRACT

A method of forming a non-volatile memory device. The method includes providing a substrate having a surface region and forming a first dielectric material overlying the surface region of the substrate. A first electrode structure is formed overlying the first dielectric material and a p+ polycrystalline silicon germanium material is formed overlying the first electrode structure. A p+ polycrystalline silicon material is formed overlying the first electrode structure using the polycrystalline silicon germanium material as a seed layer at a deposition temperature ranging from about 430 Degree Celsius to about 475 Degree Celsius without further anneal. The method forms a resistive switching material overlying the polycrystalline silicon material, and a second electrode structure including an active metal material overlying the resistive switching material.

20 Claims, 9 Drawing Sheets

(51) Int. Cl.
*H01L 21/8239* (2006.01)
*H01L 45/00* (2006.01)
*H01L 27/10* (2006.01)
*H01L 27/24* (2006.01)

(52) U.S. Cl.
CPC ........ *H01L 45/085* (2013.01); *H01L 45/1233* (2013.01); *H01L 45/146* (2013.01); *H01L 45/148* (2013.01); *H01L 45/1616* (2013.01); *H01L 45/1675* (2013.01); *H01L 21/0245* (2013.01); *H01L 21/0262* (2013.01); *H01L 21/02532* (2013.01); *H01L 21/02579* (2013.01)

(58) Field of Classification Search
USPC .................. 257/2, 3, 4, 5; 438/132, 129, 381
See application file for complete search history.

(56) References Cited

U.S. PATENT DOCUMENTS

| | | |
|---|---|---|
| 4,684,972 A | 8/1987 | Owen et al. |
| 4,741,601 A | 5/1988 | Saito |
| 4,994,866 A | 2/1991 | Awano |
| 5,139,911 A | 8/1992 | Yagi et al. |
| 5,242,855 A | 9/1993 | Oguro |
| 5,278,085 A | 1/1994 | Maddox et al. |
| 5,315,131 A | 5/1994 | Kishimoto et al. |
| 5,335,219 A | 8/1994 | Ovshinsky et al. |
| 5,360,981 A | 11/1994 | Owen et al. |
| 5,457,649 A | 10/1995 | Eichman et al. |
| 5,499,208 A | 3/1996 | Shoji |
| 5,538,564 A | 7/1996 | Kaschmitter |
| 5,541,869 A | 7/1996 | Rose et al. |
| 5,594,363 A | 1/1997 | Freeman et al. |
| 5,596,214 A | 1/1997 | Endo |
| 5,614,756 A | 3/1997 | Forouhi et al. |
| 5,627,451 A | 5/1997 | Takeda |
| 5,645,628 A | 7/1997 | Endo et al. |
| 5,673,223 A | 9/1997 | Park |
| 5,707,487 A | 1/1998 | Hori et al. |
| 5,714,416 A | 2/1998 | Eichman et al. |
| 5,751,012 A | 5/1998 | Wolstenholme et al. |
| 5,763,898 A | 6/1998 | Forouhi et al. |
| 5,840,608 A | 11/1998 | Chang |
| 5,923,587 A | 7/1999 | Choi |
| 5,970,332 A | 10/1999 | Pruijmboom et al. |
| 5,973,335 A | 10/1999 | Shannon |
| 5,998,244 A | 12/1999 | Wolstenholme et al. |
| 6,002,268 A | 12/1999 | Sasaki et al. |
| 6,037,204 A | 3/2000 | Chang et al. |
| 6,122,318 A | 9/2000 | Yamaguchi et al. |
| 6,128,214 A | 10/2000 | Kuekes et al. |
| 6,143,642 A | 11/2000 | Sur, Jr. et al. |
| 6,180,998 B1 | 1/2001 | Crafts |
| 6,181,587 B1 | 1/2001 | Kuramoto et al. |
| 6,181,597 B1 | 1/2001 | Nachumovsky |
| 6,259,116 B1 | 7/2001 | Shannon |
| 6,288,435 B1 | 9/2001 | Mei et al. |
| 6,291,836 B1 | 9/2001 | Kramer et al. |
| 6,436,765 B1 | 8/2002 | Liou et al. |
| 6,436,818 B1 | 8/2002 | Hu et al. |
| 6,492,694 B2 | 12/2002 | Noble et al. |
| 6,552,932 B1 | 4/2003 | Cernea |
| 6,627,530 B2 | 9/2003 | Li et al. |
| 6,724,186 B2 | 4/2004 | Jordil |
| 6,731,535 B1 | 5/2004 | Ooishi et al. |
| 6,740,921 B2 | 5/2004 | Matsuoka et al. |
| 6,762,474 B1 | 7/2004 | Mills, Jr. |
| 6,768,157 B2 | 7/2004 | Krieger et al. |
| 6,806,526 B2 | 10/2004 | Krieger et al. |
| 6,815,286 B2 | 11/2004 | Krieger et al. |
| 6,816,405 B1 | 11/2004 | Lu et al. |
| 6,821,879 B2 | 11/2004 | Wong |
| 6,838,720 B2 | 1/2005 | Krieger et al. |
| 6,848,012 B2 | 1/2005 | Leblanc et al. |
| 6,849,891 B1 | 2/2005 | Hsu et al. |
| 6,858,481 B2 | 2/2005 | Krieger et al. |
| 6,858,482 B2 | 2/2005 | Gilton |
| 6,864,127 B2 | 3/2005 | Yamazaki et al. |
| 6,864,522 B2 | 3/2005 | Krieger et al. |
| 6,867,618 B2 | 3/2005 | Li et al. |
| 6,881,994 B2 | 4/2005 | Lee et al. |
| 6,897,519 B1 | 5/2005 | Dosluoglu |
| 6,927,430 B2 | 8/2005 | Hsu |
| 6,939,787 B2 | 9/2005 | Ohtake et al. |
| 6,946,719 B2 | 9/2005 | Petti et al. |
| 7,020,006 B2 | 3/2006 | Chevallier et al. |
| 7,023,093 B2 | 4/2006 | Canaperi et al. |
| 7,026,702 B2 | 4/2006 | Krieger et al. |
| 7,087,454 B2 | 8/2006 | Campbell et al. |
| 7,102,150 B2 | 9/2006 | Harshfield et al. |
| 7,122,853 B1 | 10/2006 | Gaun et al. |
| 7,167,387 B2 | 1/2007 | Sugita et al. |
| 7,187,577 B1 | 3/2007 | Wang et al. |
| 7,221,599 B1 | 5/2007 | Gaun et al. |
| 7,238,607 B2 | 7/2007 | Dunton et al. |
| 7,238,994 B2 | 7/2007 | Chen et al. |
| 7,251,152 B2 | 7/2007 | Roehr |
| 7,254,053 B2 | 8/2007 | Krieger et al. |
| 7,274,587 B2 | 9/2007 | Yasuda |
| 7,289,353 B2 | 10/2007 | Spitzer et al. |
| 7,324,363 B2 | 1/2008 | Kerns et al. |
| 7,345,907 B2 | 3/2008 | Scheuerlein |
| 7,365,411 B2 | 4/2008 | Campbell |
| 7,405,418 B2 | 7/2008 | Happ et al. |
| 7,426,128 B2 | 9/2008 | Scheuerlein |
| 7,433,253 B2 | 10/2008 | Gogl et al. |
| 7,474,000 B2 | 1/2009 | Scheuerlein et al. |
| 7,479,650 B2 | 1/2009 | Gilton |
| 7,499,355 B2 | 3/2009 | Scheuerlein et al. |
| 7,515,454 B2 | 4/2009 | Symanczyk |
| 7,521,705 B2 | 4/2009 | Liu |
| 7,534,625 B2 | 5/2009 | Karpov et al. |
| 7,541,252 B2 | 6/2009 | Eun et al. |
| 7,550,380 B2 | 6/2009 | Elkins et al. |
| 7,561,461 B2 | 7/2009 | Nagai et al. |
| 7,566,643 B2 | 7/2009 | Czubatyi et al. |
| 7,606,059 B2 | 10/2009 | Toda |
| 7,615,439 B1 | 11/2009 | Schricker et al. |
| 7,629,198 B2 | 12/2009 | Kumar et al. |
| 7,648,896 B2 | 1/2010 | Herner |
| 7,667,442 B2 | 2/2010 | Itoh |
| 7,692,959 B2 | 4/2010 | Krusin-Elbaum et al. |
| 7,704,788 B2 | 4/2010 | Youn et al. |
| 7,719,001 B2 | 5/2010 | Nomura et al. |
| 7,728,318 B2 | 6/2010 | Raghuram et al. |
| 7,729,158 B2 | 6/2010 | Toda et al. |
| 7,746,601 B2 | 6/2010 | Sugiyama et al. |
| 7,746,696 B1 | 6/2010 | Paak |
| 7,749,805 B2 | 7/2010 | Pinnow et al. |
| 7,764,536 B2 | 7/2010 | Luo et al. |
| 7,772,581 B2 | 8/2010 | Lung |
| 7,776,682 B1 | 8/2010 | Nickel et al. |
| 7,778,063 B2 | 8/2010 | Brubaker et al. |
| 7,786,464 B2 | 8/2010 | Nirschl et al. |
| 7,786,589 B2 | 8/2010 | Matsunaga et al. |
| 7,791,060 B2 | 9/2010 | Aochi et al. |
| 7,800,932 B2 | 9/2010 | Kumar et al. |
| 7,824,956 B2 | 11/2010 | Schricker et al. |
| 7,829,875 B2 | 11/2010 | Scheuerlein |
| 7,830,698 B2 | 11/2010 | Chen et al. |
| 7,835,170 B2 | 11/2010 | Bertin et al. |
| 7,858,468 B2 | 12/2010 | Liu et al. |
| 7,859,884 B2 | 12/2010 | Scheuerlein |
| 7,869,253 B2 | 1/2011 | Liaw et al. |
| 7,875,871 B2 | 1/2011 | Kumar et al. |
| 7,881,097 B2 | 2/2011 | Hosomi et al. |
| 7,883,964 B2 | 2/2011 | Goda et al. |
| 7,897,953 B2 | 3/2011 | Liu |
| 7,898,838 B2 | 3/2011 | Chen et al. |
| 7,920,412 B2 | 4/2011 | Hosotani et al. |
| 7,924,138 B2 | 4/2011 | Kinoshita et al. |
| 7,927,472 B2 | 4/2011 | Takahashi et al. |
| 7,948,010 B2 | 5/2011 | Reshotko et al. |

(56) References Cited

U.S. PATENT DOCUMENTS

| | | |
|---|---|---|
| 7,968,419 B2 | 6/2011 | Li et al. |
| 7,972,897 B2 | 7/2011 | Kumar et al. |
| 7,984,776 B2 | 7/2011 | Sastry et al. |
| 8,004,882 B2 | 8/2011 | Katti et al. |
| 8,018,760 B2 | 9/2011 | Muraoka et al. |
| 8,021,897 B2 | 9/2011 | Sills et al. |
| 8,045,364 B2 | 10/2011 | Schloss et al. |
| 8,054,674 B2 | 11/2011 | Tamai et al. |
| 8,054,679 B2 | 11/2011 | Nakai et al. |
| 8,067,815 B2 | 11/2011 | Chien et al. |
| 8,071,972 B2 | 12/2011 | Lu et al. |
| 8,084,830 B2 | 12/2011 | Kanno et al. |
| 8,088,688 B1 | 1/2012 | Herner |
| 8,097,874 B2 | 1/2012 | Venkatasamy et al. |
| 8,102,018 B2 | 1/2012 | Bertin et al. |
| 8,102,698 B2 | 1/2012 | Scheuerlein |
| 8,143,092 B2 | 3/2012 | Kumar et al. |
| 8,144,498 B2 | 3/2012 | Kumar et al. |
| 8,164,948 B2 | 4/2012 | Katti et al. |
| 8,168,506 B2 | 5/2012 | Herner |
| 8,183,553 B2 | 5/2012 | Phatak et al. |
| 8,187,945 B2 | 5/2012 | Herner |
| 8,198,144 B2 | 6/2012 | Herner |
| 8,207,064 B2 | 6/2012 | Bandyopadhyay et al. |
| 8,227,787 B2 | 7/2012 | Kumar et al. |
| 8,231,998 B2 | 7/2012 | Sastry et al. |
| 8,233,308 B2 | 7/2012 | Schricker et al. |
| 8,237,146 B2 | 8/2012 | Kreupl et al. |
| 8,243,542 B2 | 8/2012 | Bae et al. |
| 8,258,020 B2 | 9/2012 | Herner |
| 8,265,136 B2 | 9/2012 | Hong et al. |
| 8,274,130 B2 | 9/2012 | Mihnea et al. |
| 8,274,812 B2 | 9/2012 | Nazarian et al. |
| 8,305,793 B2 | 11/2012 | Majewski et al. |
| 8,315,079 B2 | 11/2012 | Kuo et al. |
| 8,320,160 B2 | 11/2012 | Nazarian |
| 8,351,241 B2 | 1/2013 | Lu et al. |
| 8,369,129 B2 | 2/2013 | Fujita et al. |
| 8,369,139 B2 | 2/2013 | Liu et al. |
| 8,374,018 B2 | 2/2013 | Lu |
| 8,385,100 B2 | 2/2013 | Kau et al. |
| 8,389,971 B2 | 3/2013 | Chen et al. |
| 8,394,670 B2 | 3/2013 | Herner |
| 8,399,307 B2 | 3/2013 | Herner |
| 8,441,835 B2 | 5/2013 | Jo et al. |
| 8,456,892 B2 | 6/2013 | Yasuda |
| 8,466,005 B2 | 6/2013 | Pramanik et al. |
| 8,467,226 B2 | 6/2013 | Bedeschi et al. |
| 8,467,227 B1 | 6/2013 | Jo |
| 8,502,185 B2 | 8/2013 | Lu et al. |
| 8,569,104 B2 | 10/2013 | Pham et al. |
| 8,587,989 B2 | 11/2013 | Manning et al. |
| 8,619,459 B1 | 12/2013 | Nguyen et al. |
| 8,658,476 B1 | 2/2014 | Sun et al. |
| 8,659,003 B2 | 2/2014 | Herner et al. |
| 8,675,384 B2 | 3/2014 | Kuo et al. |
| 8,693,241 B2 | 4/2014 | Kim et al. |
| 8,853,759 B2 | 10/2014 | Lee et al. |
| 8,854,859 B2 | 10/2014 | Chung |
| 8,934,294 B2 | 1/2015 | Kim et al. |
| 8,946,667 B1 | 2/2015 | Clark et al. |
| 8,946,673 B1 | 2/2015 | Kumar |
| 8,947,908 B2 | 2/2015 | Jo |
| 8,999,811 B2 | 4/2015 | Endo et al. |
| 9,093,635 B2 | 7/2015 | Kim et al. |
| 9,166,163 B2 | 10/2015 | Gee et al. |
| 2002/0048940 A1 | 4/2002 | Derderian et al. |
| 2003/0006440 A1 | 1/2003 | Uchiyama |
| 2003/0036238 A1 | 2/2003 | Toet et al. |
| 2003/0052330 A1 | 3/2003 | Klein |
| 2003/0141565 A1 | 7/2003 | Hirose et al. |
| 2003/0174574 A1 | 9/2003 | Perner et al. |
| 2003/0194865 A1 | 10/2003 | Gilton |
| 2003/0206659 A1 | 11/2003 | Hamanaka |
| 2004/0026682 A1 | 2/2004 | Jiang |
| 2004/0036124 A1 | 2/2004 | Vyvoda et al. |
| 2004/0159835 A1 | 8/2004 | Krieger et al. |
| 2004/0170040 A1 | 9/2004 | Rinerson et al. |
| 2004/0192006 A1 | 9/2004 | Campbell et al. |
| 2004/0194340 A1 | 10/2004 | Kobayashi |
| 2004/0202041 A1 | 10/2004 | Hidenori |
| 2005/0019699 A1 | 1/2005 | Moore |
| 2005/0020510 A1 | 1/2005 | Benedict |
| 2005/0029587 A1 | 2/2005 | Harshfield |
| 2005/0041498 A1 | 2/2005 | Resta et al. |
| 2005/0052915 A1 | 3/2005 | Herner et al. |
| 2005/0062045 A1 | 3/2005 | Bhattacharyya |
| 2005/0073881 A1 | 4/2005 | Tran et al. |
| 2005/0101081 A1 | 5/2005 | Goda et al. |
| 2005/0175099 A1 | 8/2005 | Sarkijarvi et al. |
| 2005/0260826 A1 | 11/2005 | Dupuis et al. |
| 2006/0017488 A1 | 1/2006 | Hsu et al. |
| 2006/0028895 A1 | 2/2006 | Taussig et al. |
| 2006/0054950 A1 | 3/2006 | Baek et al. |
| 2006/0134837 A1 | 6/2006 | Subramanian et al. |
| 2006/0154417 A1 | 7/2006 | Shinmura et al. |
| 2006/0215445 A1 | 9/2006 | Baek et al. |
| 2006/0231910 A1 | 10/2006 | Hsieh et al. |
| 2006/0246606 A1 | 11/2006 | Hsu et al. |
| 2006/0268594 A1 | 11/2006 | Toda |
| 2006/0279979 A1 | 12/2006 | Lowrey et al. |
| 2006/0281244 A1 | 12/2006 | Ichige et al. |
| 2006/0286762 A1 | 12/2006 | Tseng et al. |
| 2006/0292301 A1 | 12/2006 | Herner |
| 2007/0008773 A1 | 1/2007 | Scheuerlein |
| 2007/0015348 A1 | 1/2007 | Hsu et al. |
| 2007/0025144 A1 | 2/2007 | Hsu et al. |
| 2007/0035990 A1 | 2/2007 | Hush |
| 2007/0042612 A1 | 2/2007 | Nishino et al. |
| 2007/0045615 A1 | 3/2007 | Cho et al. |
| 2007/0069119 A1 | 3/2007 | Appleyard et al. |
| 2007/0087508 A1 | 4/2007 | Herner et al. |
| 2007/0090425 A1 | 4/2007 | Kumar et al. |
| 2007/0091685 A1 | 4/2007 | Guterman et al. |
| 2007/0105284 A1 | 5/2007 | Herner et al. |
| 2007/0105390 A1 | 5/2007 | Oh |
| 2007/0133250 A1 | 6/2007 | Kim |
| 2007/0133270 A1 | 6/2007 | Jeong et al. |
| 2007/0159869 A1 | 7/2007 | Baek et al. |
| 2007/0159876 A1 | 7/2007 | Sugibayashi et al. |
| 2007/0171698 A1 | 7/2007 | Hoenigschmid et al. |
| 2007/0205510 A1 | 9/2007 | Lavoie et al. |
| 2007/0228414 A1 | 10/2007 | Kumar et al. |
| 2007/0284575 A1 | 12/2007 | Li et al. |
| 2007/0290186 A1 | 12/2007 | Bourim et al. |
| 2007/0291527 A1 | 12/2007 | Tsushima et al. |
| 2007/0295950 A1 | 12/2007 | Cho et al. |
| 2007/0297501 A1 | 12/2007 | Hussain et al. |
| 2008/0002481 A1 | 1/2008 | Gogl et al. |
| 2008/0006907 A1 | 1/2008 | Lee et al. |
| 2008/0007987 A1 | 1/2008 | Takashima |
| 2008/0019163 A1 | 1/2008 | Hoenigschmid et al. |
| 2008/0043521 A1 | 2/2008 | Liaw et al. |
| 2008/0048164 A1 | 2/2008 | Odagawa |
| 2008/0083918 A1 | 4/2008 | Aratani et al. |
| 2008/0089110 A1 | 4/2008 | Robinett et al. |
| 2008/0090337 A1 | 4/2008 | Williams |
| 2008/0106925 A1 | 5/2008 | Paz et al. |
| 2008/0106926 A1 | 5/2008 | Brubaker et al. |
| 2008/0106972 A1* | 5/2008 | Liang et al. .............. 367/25 |
| 2008/0165571 A1 | 7/2008 | Lung |
| 2008/0185567 A1 | 8/2008 | Kumar et al. |
| 2008/0192531 A1 | 8/2008 | Tamura et al. |
| 2008/0198934 A1 | 8/2008 | Hong et al. |
| 2008/0205179 A1 | 8/2008 | Markert et al. |
| 2008/0206931 A1 | 8/2008 | Breuil et al. |
| 2008/0220601 A1 | 9/2008 | Kumar et al. |
| 2008/0232160 A1 | 9/2008 | Gopalakrishnan |
| 2008/0278988 A1 | 11/2008 | Ufert |
| 2008/0278990 A1 | 11/2008 | Kumar et al. |
| 2008/0301497 A1 | 12/2008 | Chung et al. |
| 2008/0304312 A1 | 12/2008 | Ho et al. |
| 2008/0311722 A1 | 12/2008 | Petti et al. |
| 2009/0001343 A1 | 1/2009 | Schricker et al. |

(56) References Cited

U.S. PATENT DOCUMENTS

| | | |
|---|---|---|
| 2009/0001345 A1 | 1/2009 | Schricker et al. |
| 2009/0001347 A1* | 1/2009 | Kumar .................. H01L 27/24 257/4 |
| 2009/0003717 A1 | 1/2009 | Sekiguchi et al. |
| 2009/0014703 A1 | 1/2009 | Inaba |
| 2009/0014707 A1 | 1/2009 | Lu et al. |
| 2009/0026582 A1 | 1/2009 | Herner |
| 2009/0052226 A1 | 2/2009 | Lee et al. |
| 2009/0091981 A1 | 4/2009 | Park et al. |
| 2009/0095951 A1 | 4/2009 | Kostylev et al. |
| 2009/0109728 A1 | 4/2009 | Maejima et al. |
| 2009/0122591 A1 | 5/2009 | Ryu |
| 2009/0134432 A1 | 5/2009 | Tabata et al. |
| 2009/0140232 A1 | 6/2009 | Ufert |
| 2009/0141567 A1 | 6/2009 | Lee et al. |
| 2009/0152737 A1 | 6/2009 | Harshfield |
| 2009/0168486 A1 | 7/2009 | Kumar |
| 2009/0227067 A1 | 9/2009 | Kumar et al. |
| 2009/0231905 A1 | 9/2009 | Sato |
| 2009/0231910 A1 | 9/2009 | Liu et al. |
| 2009/0250787 A1 | 10/2009 | Kutsunai |
| 2009/0251941 A1 | 10/2009 | Saito |
| 2009/0256129 A1 | 10/2009 | Scheuerlein |
| 2009/0256130 A1 | 10/2009 | Schricker |
| 2009/0257265 A1 | 10/2009 | Chen et al. |
| 2009/0258489 A1* | 10/2009 | Chen .................. H01L 27/101 438/652 |
| 2009/0267047 A1 | 10/2009 | Sasago et al. |
| 2009/0268513 A1 | 10/2009 | De Ambroggi et al. |
| 2009/0272962 A1 | 11/2009 | Kumar et al. |
| 2009/0283737 A1 | 11/2009 | Kiyotoshi |
| 2009/0298224 A1 | 12/2009 | Lowrey |
| 2009/0309087 A1 | 12/2009 | Lung |
| 2009/0321706 A1 | 12/2009 | Happ et al. |
| 2009/0321789 A1 | 12/2009 | Wang et al. |
| 2010/0007937 A1 | 1/2010 | Inidjaja et al. |
| 2010/0012914 A1* | 1/2010 | Xu .................. H01L 27/101 257/2 |
| 2010/0019221 A1 | 1/2010 | Lung et al. |
| 2010/0019310 A1 | 1/2010 | Sakamoto |
| 2010/0025675 A1 | 2/2010 | Yamazaki et al. |
| 2010/0032637 A1 | 2/2010 | Kinoshita et al. |
| 2010/0032638 A1 | 2/2010 | Xu |
| 2010/0032640 A1 | 2/2010 | Xu |
| 2010/0034518 A1 | 2/2010 | Iwamoto et al. |
| 2010/0038791 A1 | 2/2010 | Lee et al. |
| 2010/0039136 A1 | 2/2010 | Chua-Eoan et al. |
| 2010/0044708 A1 | 2/2010 | Lin et al. |
| 2010/0044798 A1 | 2/2010 | Hooker et al. |
| 2010/0046622 A1 | 2/2010 | Doser et al. |
| 2010/0067279 A1 | 3/2010 | Choi |
| 2010/0067282 A1 | 3/2010 | Liu et al. |
| 2010/0084625 A1* | 4/2010 | Wicker .................. H01L 45/04 257/4 |
| 2010/0085798 A1 | 4/2010 | Lu et al. |
| 2010/0085822 A1 | 4/2010 | Yan et al. |
| 2010/0090192 A1* | 4/2010 | Goux .................. B82Y 10/00 257/4 |
| 2010/0101290 A1 | 4/2010 | Bertolotto |
| 2010/0102290 A1 | 4/2010 | Lu et al. |
| 2010/0110758 A1* | 5/2010 | Li .................. G11C 13/0007 365/148 |
| 2010/0110767 A1 | 5/2010 | Katoh et al. |
| 2010/0118587 A1 | 5/2010 | Chen et al. |
| 2010/0140614 A1 | 6/2010 | Uchiyama et al. |
| 2010/0157651 A1 | 6/2010 | Kumar et al. |
| 2010/0157656 A1 | 6/2010 | Tsuchida |
| 2010/0157659 A1 | 6/2010 | Norman |
| 2010/0157710 A1 | 6/2010 | Hsu |
| 2010/0163828 A1 | 7/2010 | Tu |
| 2010/0171086 A1 | 7/2010 | Lung et al. |
| 2010/0176367 A1 | 7/2010 | Liu |
| 2010/0176368 A1 | 7/2010 | Ko et al. |
| 2010/0182821 A1 | 7/2010 | Muraoka et al. |
| 2010/0203731 A1 | 8/2010 | Kong et al. |
| 2010/0219510 A1 | 9/2010 | Scheuerlein et al. |
| 2010/0221868 A1 | 9/2010 | Sandoval |
| 2010/0237314 A1 | 9/2010 | Tsukamoto et al. |
| 2010/0243983 A1 | 9/2010 | Chiang et al. |
| 2010/0258781 A1 | 10/2010 | Phatak et al. |
| 2010/0271885 A1 | 10/2010 | Scheuerlein et al. |
| 2010/0277969 A1 | 11/2010 | Li et al. |
| 2010/0321095 A1 | 12/2010 | Mikawa et al. |
| 2011/0006275 A1 | 1/2011 | Roelofs et al. |
| 2011/0007551 A1 | 1/2011 | Tian et al. |
| 2011/0033967 A1 | 2/2011 | Lutz et al. |
| 2011/0063888 A1 | 3/2011 | Chi et al. |
| 2011/0066878 A1 | 3/2011 | Hosono et al. |
| 2011/0068373 A1 | 3/2011 | Minemura et al. |
| 2011/0069533 A1 | 3/2011 | Kurosawa et al. |
| 2011/0089391 A1 | 4/2011 | Mihnea et al. |
| 2011/0122679 A1 | 5/2011 | Chen et al. |
| 2011/0128779 A1 | 6/2011 | Redaelli et al. |
| 2011/0133149 A1 | 6/2011 | Sonehara |
| 2011/0136327 A1 | 6/2011 | Han et al. |
| 2011/0151277 A1 | 6/2011 | Nishihara et al. |
| 2011/0155991 A1 | 6/2011 | Chen |
| 2011/0183475 A1* | 7/2011 | Purayath .................. H01L 27/1021 438/129 |
| 2011/0183525 A1 | 7/2011 | Purushothaman et al. |
| 2011/0193051 A1 | 8/2011 | Nam et al. |
| 2011/0194329 A1 | 8/2011 | Ohba et al. |
| 2011/0198557 A1 | 8/2011 | Rajendran et al. |
| 2011/0204312 A1 | 8/2011 | Phatak |
| 2011/0204314 A1 | 8/2011 | Baek et al. |
| 2011/0205780 A1 | 8/2011 | Yasuda et al. |
| 2011/0205782 A1 | 8/2011 | Costa et al. |
| 2011/0212616 A1 | 9/2011 | Seidel et al. |
| 2011/0227028 A1 | 9/2011 | Sekar et al. |
| 2011/0284814 A1 | 11/2011 | Zhang |
| 2011/0299324 A1 | 12/2011 | Li et al. |
| 2011/0305064 A1 | 12/2011 | Jo et al. |
| 2011/0305066 A1* | 12/2011 | Nazarian .................. G11C 13/0011 365/148 |
| 2011/0310655 A1 | 12/2011 | Kreupl et al. |
| 2011/0310656 A1 | 12/2011 | Kreupl et al. |
| 2011/0312151 A1* | 12/2011 | Herner .................. H01L 45/148 438/384 |
| 2011/0315992 A1* | 12/2011 | Nguyen .................. H01L 21/02381 257/66 |
| 2011/0317470 A1 | 12/2011 | Lu et al. |
| 2012/0001145 A1 | 1/2012 | Magistretti et al. |
| 2012/0001146 A1 | 1/2012 | Lu et al. |
| 2012/0007035 A1 | 1/2012 | Jo et al. |
| 2012/0008366 A1 | 1/2012 | Lu |
| 2012/0012806 A1 | 1/2012 | Herner |
| 2012/0012808 A1 | 1/2012 | Herner |
| 2012/0015506 A1 | 1/2012 | Jo et al. |
| 2012/0025161 A1 | 2/2012 | Rathor et al. |
| 2012/0033479 A1 | 2/2012 | Delucca et al. |
| 2012/0043518 A1 | 2/2012 | Cheng et al. |
| 2012/0043519 A1* | 2/2012 | Jo et al. .................. 257/4 |
| 2012/0043520 A1 | 2/2012 | Herner et al. |
| 2012/0043621 A1 | 2/2012 | Herner |
| 2012/0043654 A1 | 2/2012 | Lu et al. |
| 2012/0044751 A1 | 2/2012 | Wang et al. |
| 2012/0074374 A1 | 3/2012 | Jo |
| 2012/0074507 A1 | 3/2012 | Jo et al. |
| 2012/0076203 A1 | 3/2012 | Sugimoto et al. |
| 2012/0080798 A1 | 4/2012 | Harshfield |
| 2012/0087169 A1 | 4/2012 | Kuo et al. |
| 2012/0087172 A1 | 4/2012 | Aoki |
| 2012/0091420 A1 | 4/2012 | Kusai et al. |
| 2012/0104351 A1 | 5/2012 | Wei et al. |
| 2012/0108030 A1 | 5/2012 | Herner |
| 2012/0120712 A1 | 5/2012 | Kawai et al. |
| 2012/0122290 A1 | 5/2012 | Nagashima |
| 2012/0140816 A1 | 6/2012 | Franche et al. |
| 2012/0142163 A1 | 6/2012 | Herner |
| 2012/0145984 A1* | 6/2012 | Rabkin .................. H01L 29/6609 257/2 |
| 2012/0147657 A1 | 6/2012 | Sekar et al. |
| 2012/0155146 A1 | 6/2012 | Ueda et al. |

(56) References Cited

U.S. PATENT DOCUMENTS

| | | |
|---|---|---|
| 2012/0176831 A1 | 7/2012 | Kiao et al. |
| 2012/0205606 A1 | 8/2012 | Lee et al. |
| 2012/0205793 A1 | 8/2012 | Schieffer et al. |
| 2012/0218807 A1 | 8/2012 | Johnson |
| 2012/0220100 A1 | 8/2012 | Herner |
| 2012/0224413 A1 | 9/2012 | Zhang et al. |
| 2012/0235112 A1 | 9/2012 | Huo et al. |
| 2012/0236625 A1 | 9/2012 | Ohba et al. |
| 2012/0241710 A1 | 9/2012 | Liu et al. |
| 2012/0243292 A1* | 9/2012 | Takashima .............. G11C 11/56 365/148 |
| 2012/0250183 A1 | 10/2012 | Tamaoka et al. |
| 2012/0252183 A1 | 10/2012 | Herner |
| 2012/0269275 A1 | 10/2012 | Hannuksela |
| 2012/0298947 A1 | 11/2012 | Clark |
| 2012/0305874 A1 | 12/2012 | Herner |
| 2012/0305879 A1 | 12/2012 | Lu et al. |
| 2012/0320660 A1 | 12/2012 | Nazarian et al. |
| 2012/0326265 A1 | 12/2012 | Lai et al. |
| 2012/0327701 A1 | 12/2012 | Nazarian |
| 2013/0020548 A1 | 1/2013 | Clark et al. |
| 2013/0023085 A1 | 1/2013 | Pramanik et al. |
| 2013/0026440 A1 | 1/2013 | Yang et al. |
| 2013/0065066 A1 | 3/2013 | Sambasivan et al. |
| 2013/0075685 A1 | 3/2013 | Li et al. |
| 2013/0075688 A1 | 3/2013 | Xu et al. |
| 2013/0119341 A1 | 5/2013 | Liu et al. |
| 2013/0128653 A1 | 5/2013 | Kang et al. |
| 2013/0134379 A1 | 5/2013 | Lu |
| 2013/0166825 A1 | 6/2013 | Kim et al. |
| 2013/0168629 A1 | 7/2013 | Ribeiro et al. |
| 2013/0207065 A1 | 8/2013 | Chiang |
| 2013/0214234 A1 | 8/2013 | Gopalan et al. |
| 2013/0235648 A1 | 9/2013 | Kim et al. |
| 2013/0264535 A1 | 10/2013 | Sonehara |
| 2013/0279240 A1 | 10/2013 | Jo |
| 2013/0308369 A1 | 11/2013 | Lu et al. |
| 2014/0015018 A1 | 1/2014 | Kim |
| 2014/0029327 A1 | 1/2014 | Strachan et al. |
| 2014/0070160 A1 | 3/2014 | Ishikawa et al. |
| 2014/0103284 A1 | 4/2014 | Hsueh et al. |
| 2014/0145135 A1 | 5/2014 | Gee et al. |
| 2014/0166961 A1 | 6/2014 | Liao et al. |
| 2014/0175360 A1 | 6/2014 | Tendulkar et al. |
| 2014/0177315 A1 | 6/2014 | Pramanik et al. |
| 2014/0192589 A1 | 7/2014 | Maxwell et al. |
| 2014/0197369 A1 | 7/2014 | Sheng et al. |
| 2014/0233294 A1 | 8/2014 | Ting et al. |
| 2014/0264236 A1 | 9/2014 | Kim et al. |
| 2014/0264250 A1 | 9/2014 | Maxwell et al. |
| 2014/0268997 A1 | 9/2014 | Nazarian et al. |
| 2014/0268998 A1 | 9/2014 | Jo |
| 2014/0269002 A1 | 9/2014 | Jo |
| 2014/0312296 A1 | 10/2014 | Jo et al. |
| 2014/0335675 A1 | 11/2014 | Narayanan |
| 2015/0070961 A1 | 3/2015 | Katayama et al. |
| 2015/0228334 A1 | 8/2015 | Nazarian et al. |
| 2016/0111640 A1 | 4/2016 | Chang et al. |

FOREIGN PATENT DOCUMENTS

| | | |
|---|---|---|
| CN | 101501850 A | 8/2009 |
| CN | 101636792 A | 1/2010 |
| CN | 102024494 A | 4/2011 |
| CN | 102077296 A | 5/2011 |
| EP | 1096465 A2 | 5/2001 |
| EP | 2405441 A1 | 1/2012 |
| EP | 2408035 A2 | 1/2012 |
| JP | 2005-506703 A | 3/2005 |
| JP | 2005506703 A | 3/2005 |
| JP | 2006-032951 A | 2/2006 |
| JP | 2006032951 A | 2/2006 |
| JP | 2007-067408 A | 3/2007 |
| JP | 2007067408 A | 3/2007 |
| JP | 2007-281208 A | 10/2007 |
| JP | 2007281208 A | 10/2007 |
| JP | 2007-328857 A | 12/2007 |
| JP | 2007328857 A | 12/2007 |
| JP | 2008503085 A | 1/2008 |
| JP | 2008147343 A | 6/2008 |
| JP | 2009043873 A | 2/2009 |
| JP | 2011023645 A | 2/2011 |
| JP | 2011065737 A | 3/2011 |
| JP | 2012504840 A | 2/2012 |
| JP | 2012505551 A | 3/2012 |
| JP | 2012089567 A | 5/2012 |
| JP | 2012533195 A | 12/2012 |
| KR | 20090051206 A | 5/2009 |
| KR | 10-2011-0014248 A | 2/2011 |
| KR | 20110014248 A | 2/2011 |
| WO | 3034498 A1 | 4/2003 |
| WO | WO 03/034498 A1 | 4/2003 |
| WO | 2005124787 A2 | 12/2005 |
| WO | 2009005699 A1 | 1/2009 |
| WO | WO 2009/005699 A1 | 1/2009 |
| WO | 2010026654 A1 | 3/2010 |
| WO | 2010042354 A1 | 4/2010 |
| WO | 2010042732 A2 | 4/2010 |
| WO | 2011005266 A1 | 1/2011 |
| WO | 2011008654 A1 | 1/2011 |
| WO | 2011133138 A1 | 10/2011 |

OTHER PUBLICATIONS

Andre Dehon, "Array-Based Architecture for FET-Based, Nanoscale Electronics", IEEE Transactions on Nanotechnology, Mar. 2003, pp. 23-32, vol. 2, No. 1.

Herb Goronkin et al., "High-Performance Emerging Solid-State Memory Technologies", MRS Bulletin, Nov. 2004, pp. 805-813, www.mrs.org/publications/bulletin.

Gerhard Muller et al., "Status and Outlook of Emerging Nonvolatile Memory Technologies", IEEE, 2004, pp. 567-570.

A.E. Owen et al., "Memory Switching in Amorphous Silicon Devices", Journal of Non-Crystalline Solids 59 & 60, 1983, pp. 1273-1280, North-Holland Publishing Company.

J. Campbell Scott, "Is There an Immortal Memory?", www.sciencemag.org, Apr. 2, 2004, pp. 62-63, vol. 304, No. 5667.

S.H. Lee et al., "Full Integration and Cell Characteristics for 64Mb Nonvolatile PRAM", 2004 Symposium on VLSI Technology Digest of Technical Papers, pp. 20-21, 2004.

Stephen Y. Chou et al., "Imprint Lithography With 25-Nanometer Resolution", Science, Apr. 5, 1996, pp. 85-87, vol. 272.

S. Zankovych et al., "Nanoimprint Lithography: Challenges and Prospects", Institute of Physics Publishing, Nanotechnology 12, 2001, pp. 91-95.

A. Avila et al., "Switching in Coplanar Amorphous Hydrogenated Silicon Devices", Solid-State Electronics 44, 2000, pp. 17-27.

Jian Hu et al., "Switching and Filament Formation in Hot-Wire CVD P-Type A-Si:H Devices", Science Direct, Thin Solid Films 430, 2003, pp. 249-252, www.sciencedirect.com.

S. Hudgens et al,. "Overview of Phase-Change Chalcogenide Nonvolatile Memory Technology", MRS Bulletin, Nov. 2004, pp. 829-832, www.mrs.org/publications/bulletin.

K. Terabe et al., "Quantized Conductance Atomic Switch", Nature, vol. 433, Jan. 6, 2005, pp. 47-50, www.nature.com/ nature.

Michael Kund et al., "Conductive Bridging RAM (CBRAM): An Emerging Non-Volatile Memory Technology Scalable to Sub 20nm", IEEE, 2005.

W. Den Boer, "Threshold Switching in Hydrogenated Amorphous Silicon", American Institute of Physics, 1982, pp. 812-813.

P.G. Lecomber et al., "The Switching Mechnism in Amorphous Silicon Junctions", Journal of Non-Crystalline Solids 77 & 78, 1985, pp. 1373-1382, North-Holland, Amsterdam.

A. E. Owen et al., "Switching in Amorphous Devices", Int. J. Electronics, 1992, pp. 897-906, vol. 73, No. 5.

M. Jafar et al., "Switching in Amorphous-Silicon Devices", The American Physical Society, 1994, pp. 611-615, vol. 49, No. 19.

(56) References Cited

OTHER PUBLICATIONS

Stikeman, Alexandra, "Polymer Memory—The Plastic Path to Better Data Storage," Technology Review, Sep. 2002, p. 31, www.technologyreview.com.
Yong Chen et al. "Nanoscale molecular-switch crossbar circuits," Nanotechnology 14, 2003, pp. 462-468, vol. 1.14, Institute of Physics Publishing.
C.P. Collier et al. "Electronically Configurable Molecular-Based Logic Gates," Science, Jul. 16, 1999, pp. 391-395, vol. 285, No. 5426.
Office Action for U.S. Appl. No. 11/875,541, dated Jul. 22, 2010.
Office Action for U.S. Appl. No. 11/875,541, dated Mar. 30, 2011.
Office Action for U.S. Appl. No. 11/875,541, dated Oct. 5, 2011.
Office Action for U.S. Appl. No. 11/875,541, dated Jun. 8, 2012.
Choi, Jang Wook, "Molecular Electronic Crossbar Memory Circuits", Bistable [2]Rotaxane Based Molecular Electronics: Fundamentals and Applications, Chapter 3, pp. 79-124, Dissertation, California Institute of Technology.
Sung-Hyun Jo et al., "A Silicon-Based Crossbar Ultra-High-Density Non-Volatile Memory", SSEL Annual Report 2007.
International Search Report for PCT/US2009/060023, filed on Oct. 8, 2009.
Waser, R et al., "Nanoionics-based Resistive Switching Memories", Nature Materials, Nov. 2007, pp. 833-835, vol. 6.
Written Opinion of the International Searching Authority for PCT/US2009/060023, filed on Oct. 8, 2009.
*Ex Parte Quayle* Action for U.S. Appl. No. 12/826,653, dated May 8, 2012.
International Search Report for PCT/US2011/040090, filed on Jun. 10, 2011.
Written Opinion of the International Searching Authority for PCT/US2011/040090, filed on Jun. 10, 2011.
Notice of Allowability for U.S. Appl. No. 13/158,231, dated Apr. 17, 2012.
Office Action for U.S. Appl. No. 12/835,704, dated Sep. 21, 2011.
Office Action for U.S. Appl. No. 12/835,704, dated Mar. 1, 2012.
Advisory Action for U.S. Appl. No. 12/835,704, dated Jun. 8, 2012.
International Search Report and Written Opinion for PCT/US2011/046035, filed on Jul. 29, 2011.
Office Action for U.S. Appl. No. 12/861,650, dated Jan. 25, 2012.
Notice of Allowability for U.S. Appl. No. 12/861,650, dated Jun. 19, 2012.
Sung Hyun Jo et al., "Programmable Resistance Switching in Nanoscale Two-Terminal Devices," Supporting Information, Dec. 29, 2008, pp. 1-4, vol. 9. No. 1, Department of Electrical Engineering and Computer Science, the University of Michigan, Ann Arbor, Michigan.
Kuk-Hwan Kim et al., "Nanoscale resistive memory with intrinsic diode characteristics and long endurance," Applied Physics Letters, 2010, pp. 053106-1-053106-3, vol. 96, American Institute of Physics.
Sung Hyun Jo et al., Si-Based Two-Terminal Resistive Switching Nonvolatile Memory, 2008, IEEE.
Sung Hyun Jo et al., "Nanoscale Memristor Device as Synapse in Neuromorphic Systems", Nano Letters, 2010, pp. 1297-1301, pubs.acs.org/NanoLett, A-E, American Chemical Society Publications.
Wei Lu et al., "Nanoelectronics from the bottom up," Nature Materials—Review Articles | Insight www.nature.com/naturematerials, Nov. 2007, pp. 841-850, vol. 6, Nature Publishing Group.
Sung Hyun Jo et al., "Ag/a-Si:H/c-Si Resistive Switching Nonvolatile Memory Devices," 2006.
Sung Hyun Jo et al., "Experimental, Modeling and Simulation Studies of Nanoscale Resistance Switching Devices," 2009, IEEE.
Sung Hyun Jo et al., "Nonvolatile Resistive Switching Devices Based on Nanoscale Metal/Amorphous Silicon/Crystalline Silicon Junctions," Mater. Res. Soc. Symp. Proc., 2007, vol. 997, Materials Research Society.
Sung Hyun Jo et al., "Si Memristive Devices Applied to Memory and Neuromorphic Circuits."

Wei Lu et al., "Supporting Information," 2008.
Sung Hyun Jo et al., "High-Density Crossbar Arrays Based on a Si Memristive System," Nano Letters, 2009, pp. 870-874, vol. 9, No. 2, American Chemical Society Publications.
Sung Hyun Jo et al., "High-Density Crossbar Arrays Based on a Si Memristive System," Supporting Information, 2009, pp. 1-4.
Sung Hyun Jo et al., "Programmable Resistance Switching in Nanoscale Two-Terminal Devices," Nano Letters, 2009, pp. 496-500, vol. 9, No. 1, American Chemical Society Publications.
Shubhra Gangopadhyay et al., "Memory Switching in Sputtered Hydrogenated Amorphous Silicon (a-Si:H)", Japanese Journal of Applied Physics, Short Notes, 1985, pp. 1363-1364, vol. 24, No. 10, JPN. J. Appl. Phys.
S. K. Dey, "Electrothermal model of switching in amorphous silicon films", J. Vac. Sci. Technol., Jan./Feb. 1980, pp. 445-448, vol. 17, No. 1, American Vacuum Society.
J. Hajto et al., "The Programmability of Amorphous Silicon Analogue Memory Elements", Mat. Res. Soc. Symp. Proc., 1990, pp. 405-410, vol. 192, Materials Research Society.
M. J. Rose et al., "Amorphous Silicon Analogue Memory Devices", Journal of Non-Crystalline Solids 115, 1989, pp. 168-170, Elsevier Science Publishers B.V., North-Holland.
A. Moopenn et al., "Programmable Synaptic Devices for Electronic Neural Nets", Control and Computers, 1990, pp. 37-41, vol. 18, No. 2.
P.G. Le Comber, "Present and Future Applications of Amorphous Silicon and Its Alloys", Journal of Non-Crystalline Solids, 115, 1989, pp. 1-13, Elsevier Science Publishers B.V., North-Holland.
Hu, J., et al., "AC Characteristics of Cr/p/sup +/ A-Si:HIV Analog Switching Devices", IEEE Transactions on Electron Devices, Sep. 2000, pp. 1751-1757, vol. 47, No. 9.
Owen, A.E. et al., "New amorphous-silicon electrically programmable nonvolatile switching device," Solid-State and Electron Devices, IEEE Proceedings I, Apr. 1982, pp. 51-54, vol. 129, No. 2.
J. Hajto et al., "Amorphous & Microcrystalline Semiconductor Devices: vol. 2, Materials and Device Physics", Mar. 1, 2004, pp. 640-700, Artech House Publishers.
J. Hajto et al., "Analogue memory and ballistic electron effects in metal-amorphous silicon structures," Philosophical Magazine B, 1991, pp. 349-369, vol. 63, No. 1, Taylor & Francis Ltd.
A. J. Holmes et al., "Design of Analogue Synapse Circuits using Non-Volatile a-Si:H Memory Devices", Proceedings of ISCAS, 1994, pp. 351-354.
Dong, Y., et al., "Si/a-Si Core/Shell Nanowires as Nonvolatile Crossbar Switches", Nano Letters, Jan. 2008, pp. 386-391, vol. 8, No. 2.
European Search Report for Application No. EP 09 81 9890.6 of Mar. 27, 2012.
D. A. Muller et al., "The Electronic Structure at the Atomic Scale of Ultrathin Gate Oxides", Nature, Jun. 24, 1999, pp. 758-761, vol. 399, No. 24.
Sune, J. et al., "Nondestructive Multiple Breakdown Events in Very Thin SiO2 Films", Applied Physics Letters, 1989, vol. 55 No. 128.
Herve Marand, "Material Engineering Science", MESc 5025, Chapter 7, University of Vermont, http://www.files.chem.vt.edu/chemdeptimarand/MEScchap6-1 c.pdf.
Owen, A. E. et al., "Electronic switching in amorphous silicon devices: properties of the conducting filament", Proceedings of 5th International Conference on Solid-State and Integrated Circuit Technology, 1998, pp. 830-833.
Jo, Sung Hyun, "Nanoscale Memristive Devices for Memory and Logic Applications", Thesis, University of Michigan, 2010.
Office Action for U.S. Appl. No. 12/894,098, dated Aug. 1, 2012.
Sung Hyun Jo et al., "CMOS Compatible Nanoscale Nonvolatile Resistance Switching Memory," Nano Letters, 2008, pp. 392-397, vol. 8, No. 2, American Chemical Society Publications.
Office Action for U.S. Appl. No. 12/582,086, dated Apr. 19, 2011.
Office Action for U.S. Appl. No. 12/582,086, dated Sep. 6, 2011.
Notice of Allowance for U.S. Appl. No. 12/582,086, dated Oct. 21, 2011.
International Search Report for PCT/US2009/061249, filed on Oct. 20, 2009.

(56) References Cited

OTHER PUBLICATIONS

Written Opinion of the International Searching Authority for PCT/US2009/061249, filed on Oct. 20, 2009.
Office Action for U.S. Appl. No. 12/861,650, dated Oct. 16, 2012.
Notice of Allowance for U.S. Appl. No. 12/894,087, dated Oct. 25, 2012.
Notice of Allowance for U.S. Appl. No. 13/149,807, dated Oct. 29, 2012.
Notice of Allowance for U.S. Appl. No. 12/861,666, dated Nov. 14, 2012.
Office Action for U.S. Appl. No. 13/156,232, dated Nov. 26, 2012.
Notice of Allowance for U.S. Appl. No. 13/290,024, dated Nov. 28, 2012.
Notice of Allowance for U.S. Appl. No. 12/814,410, dated Jan. 8, 2013.
Corrected Notice of Allowance for U.S. Appl. No. 12/861,666, dated Jan. 11, 2013.
Supplemental Notice of Allowance for U.S. Appl. No. 12/894,087, dated Jan. 11, 2013.
Notice of Allowance for U.S. Appl. No. 13/314,513, dated Jan. 24, 2013.
Notice of Allowance for U.S. Appl. No. 13/118,258, dated Feb. 6, 2013.
International Search Report and Written Opinion for PCT/US2012/040242, filed May 31, 2012.
Office Action for U.S. Appl. No. 13/174,264, dated Mar. 6, 2013.
Office Action for U.S. Appl. No. 13/679,976, dated Mar. 6, 2013.
Notice of Allowance for U.S. Appl. No. 12/894,098, dated Mar. 15, 2013.
Office Action for U.S. Appl. No. 13/465,188, dated Mar. 19, 2013.
Office Action for U.S. Appl. No. 12/861,432, dated Mar. 29, 2013.
Notice of Allowance for U.S. Appl. No. 13/748,490, dated Apr. 9, 2013.
Office Action for U.S. Appl. No. 13/725,331, dated May 20, 2013.
International Search Report and Written Opinion for PCT/US2012/045312, filed on Jul. 2, 2012.
Office Action for U.S. Appl. No. 13/466,008, dated Jul. 29, 2013.
Russo, Ugo et al., "Self-Accelerated Thermal Dissolution Model for Reset Programming in Unipolar Resistive-Switching Memory (RRAM) Devices", IEEE Transactions on Electron Devices, Feb. 2009, pp. 193-200, vol. 56, No. 2.
Cagli, C. et al., "Evidence for threshold switching in the set process of NiO-based RRAM and physical modeling for set, reset, retention and disturb prediction", IEEE International Electron Devices Meeting, Dec. 15-17, 2008, pp. 1-4, San Francisco, CA.
Office Action for U.S. Appl. No. 13/077,941, dated Aug. 12, 2013.
Office Action for U.S. Appl. No. 13/436,714, dated Aug. 27, 2013.
Notice of Allowance for U.S. Appl. No. 13/679,976, dated Sep. 17, 2013.
Office Action for U.S. Appl. No. 13/189,401, dated Sep. 30, 2013.
Office Action for U.S. Appl. No. 13/462,653, dated Sep. 30, 2013.
Corrected Notice of Allowance for U.S. Appl. No. 13/733,828, dated Oct. 1, 2013.
Notice of Allowance for U.S. Appl. No. 13/733,828, dated Aug. 8, 2013.
Office Action for U.S. Appl. No. 13/594,665, dated Aug. 2, 2013.
Notice of Allowance for U.S. Appl. No. 13/769,152, dated Oct. 8, 2013.
Notice of Allowance for U.S. Appl. No. 13/905,074, dated Oct. 8, 2013.
Notice of Allowance for U.S. Appl. No. 13/452,657, dated Oct. 10, 2013.
Notice of Allowance for U.S. Appl. No. 13/174,264, dated Oct. 16, 2013.
Notice of Allowance for U.S. Appl. No. 13/417,135, dated Oct. 23, 2013.
Notice of Allowance for U.S. Appl. No. 13/725,331, dated Jan. 17, 2014.
Office Action for U.S. Appl. No. 13/739,283, dated Jan. 16, 2014.
Office Action for U.S. Appl. No. 13/920,021, dated Jan. 10, 2014.
Office Action for U.S. Appl. No. 12/861,432, dated Jan. 8, 2014.
Office Action for U.S. Appl. No. 13/586,815, dated Jan. 29, 2014.
International Search Report and Written Opinion for PCT/US2013/061244, filed on Sep. 23, 2013.
Office Action for U.S. Appl. No. 13/434,567, dated Feb. 6, 2014.
Office Action for U.S. Appl. No. 13/620,012, dated Feb. 11, 2014.
Notice of Allowance for U.S. Appl. No. 13/468,201, dated Feb. 20, 2014.
Office Action for U.S. Appl. No. 12/625,817, dated Feb. 28, 2014.
Office Action for U.S. Appl. No. 12/835,704, dated Mar. 14, 2014.
Office Action for U.S. Appl. No. 13/870,919, Dated Apr. 3, 2014.
Office Action for U.S. Appl. No. 13/167,920, dated Mar. 12, 2014.
International Search Report and Written Opinion for PCT/US2013/077628, filed on Dec. 23, 2013.
Office Action for U.S. Appl. No. 12/814,410 dated Apr. 17, 2012.
Office Action for U.S. Appl. No. 12/835,699 dated Aug. 24, 2011.
Notice of Allowance for U.S. Appl. No. 12/835,699 dated Feb. 6, 2012.
Office Action for U.S. Appl. No. 12/833,898 dated Apr. 5, 2012.
European Search Report for Application No. EP 1100 5207.3 of Oct. 12, 2011.
Notice of Allowance for U.S. Appl. No. 12/833,898 dated May 30, 2012.
Notice of Allowance for U.S. Appl. No. 12/939,824 dated May 11, 2012.
Notice of Allowance for U.S. Appl. No. 12/940,920 dated Oct. 5, 2011.
Office Action for U.S. Appl. No. 13/314,513 dated Mar. 27, 2012.
Shong Yin, "Solution Processed Silver Sulfide Thin Films for Filament Memory Applications", Technical Report No. UCB/EECS-2010-166, http://www.eecs.berkeley.edu/Pubs/TechRpts/2010/EECS-2010-166.html, Dec. 17, 2010, Electrical Engineering and Computer Sciences, University of California at Berkeley.
Office Action for U.S. Appl. No. 13/149,653 dated Apr. 25, 2012.
International Search Report for PCT/US2011/045124 filed on Jul. 22, 2011.
Written Opinion of the international Searching Authority for PCT/US2011/045124 filed on Jul. 22, 2011.
Peng-Heng Chang et al, "Aluminum spiking at contact windows in Al/Ti-W/Si", Appl. Phys. Lett., Jan. 25, 1988, pp. 272-274, vol. 52 No. 4, American Institute of Physics.
J. Del Alamo et al., "Operating limits of Al-alloyed high-low junction for BSF solar cells", Solid-State Electronics, 1981, pp. 415-420, vol. 24, Pergamon Press Ltd., Great Britain.
Hao-Chih Yuan et al., "Silicon Solar Cells with Front Hetero-Contact and Aluminum Alloy Back Junction", NREL Conference Paper CP-520-42566, 33rd IEEE Photovoltaic Specialists Conference, May 11-16, 2008, National Renewable Energy Laboratory, San Diego, California.
Notice of Allowance for U.S. Appl. No. 12/939,824 dated Jul. 24, 2012.
Office Action for Application No. EP 1100 5207.3 mailed Aug. 8, 2012.
Office Action for U.S. Appl. No. 13/417,135 dated Oct. 9, 2012.
Notice of Allowance for U.S. Appl. No. 13/532,019 dated Nov. 14, 2012.
Office Action for U.S. Appl. No. 13/149,653 dated Nov. 20, 2012.
Office Action of U.S. Appl. No. 13/436,714 dated Dec. 7, 2012.
Office Action for U.S. Appl. No. 13/143,047, dated Apr. 11, 2014.
Office Action for U.S. Appl. No. 13/761,132, dated Apr. 25, 2014.
Office Action for U.S. Appl. No. 14/072,657, dated Jun. 17, 2014
Notice of Allowance dated Sep. 18, 2014 for U.S. Appl. No. 13/586,815, filed Aug. 15, 2012.
Notice of Allowance dated Jun. 19, 2012 for U.S. Appl. No. 12/861,650 filed Aug. 23, 2010.
Notice of Allowance dated Sep. 19, 2013 for U.S. Appl. No. 13/585,759 filed Aug. 14, 2012.
Notice of Allowance dated Apr. 2, 2013 for U.S. Appl. No. 13/149,757 filed May 31, 2011.
Notice of Allowance dated Feb. 10, 2015 for U.S. Appl. No. 13/525,096 filed Jun. 15, 2012.
Notice of Allowance dated Feb. 20, 2014 for U.S. Appl. No. 13/468,201 filed May 10, 2012.

(56) References Cited

OTHER PUBLICATIONS

Notice of Allowance dated Mar. 20, 2014 for U.S. Appl. No. 13/598,550 filed Aug. 29, 2012.
Notice of Allowance dated Mar. 20, 2014 for U.S. Appl. No. 13/461,725, filed May 1, 2012.
Notice of Allowance dated Oct. 21, 2011 for U.S. Appl. No. 12/582,086 filed Oct. 20, 2009.
Notice of Allowance dated Oct. 21, 2014 for U.S. Appl. No. 13/426,869 filed Mar. 22, 2012.
Notice of Allowance dated May 22, 2012 for U.S. Appl. No. 12/815,369 filed Jun. 14, 2010.
Notice of Allowance dated Dec. 23, 2015 for U.S. Appl. No. 14/573,770.
Notice of Allowance dated Oct. 23, 2013 for U.S. Appl. No. 13/417,135 filed Mar. 9, 2012.
Notice of Allowance dated Jan. 24, 2013 for U.S. Appl. No. 13/314,513 filed Dec. 8, 2011.
Notice of Allowance dated Jul. 24, 2012 for U.S. Appl. No. 12/939,824 filed Nov. 4, 2010.
Notice of Allowance dated Oct. 25, 2012 for U.S. Appl. No. 12/894,087 filed Sep. 29, 2010.
Notice of Allowance dated Sep. 25, 2014 for U.S. Appl. No. 13/447,036 filed Apr. 13, 2012.
Notice of Allowance dated Sep. 26, 2014 for U.S. Appl. No. 13/594,665 filed Aug. 24, 2012.
Notice of Allowance dated Aug. 27, 2014 for U.S. Appl. No. 13/077,941, filed Mar. 31, 2011.
Notice of Allowance dated Nov. 28, 2012 for U.S. Appl. No. 13/290,024 filed Nov. 4, 2011.
Notice of Allowance dated Oct. 28, 2013 for U.S. Appl. No. 13/194,500 filed Jul. 29, 2011.
Notice of Allowance dated Oct. 28, 2013 for U.S. Appl. No. 13/651,169 filed Oct. 12, 2012.
Notice of Allowance dated Nov. 29, 2012 for U.S. Appl. No. 12/815,318 filed Jun. 14, 2010.
Notice of Allowance dated Oct. 29, 2012 for U.S. Appl. No. 13/149,807 filed May 31, 2011.
Notice of Allowance dated May 30, 2012 for U.S. Appl. No. 12/833,898 filed Jul. 9, 2010.
Notice of Allowance dated Sep. 30, 2013 for U.S. Appl. No. 13/481,696 filed May 25, 2012.
Notice of Allowance dated Aug. 31, 2012 for U.S. Appl. No. 13/051,296 filed Mar. 18, 2011.
Notice of Allowance dated Apr. 20, 2016 for U.S. Appl. No. 14/573,817.
Notice of Allowance dated Oct. 8, 2014 for U.S. Appl. No. 13/077,941, filed Mar. 31, 2011.
Notice of Allowance dated Aug. 26, 2015 for U.S. Appl. No. 14/034,390.
Notice of Allowance dated Sep. 8, 2015 for U.S. Appl. No. 14/613,299.
Office Action dated Dec. 31, 2015 for U.S. Appl. No. 14/692,677, 27 pages.
Office Action dated Feb. 5, 2015 for U.S. Appl. No. 14/027,045, 6 pages.
Office Action dated Apr. 11, 2014 for U.S. Appl. No. 13/594,665, 44 pages.
Office Action dated Apr. 6, 2015 for U.S. Appl. No. 13/912,136, 23 pages.
Office Action for U.S. Appl. No. 14/611,022 dated May 7, 2015, 13 pages.
Office Action for U.S. Appl. No. 14/612,025 dated Feb. 1, 2016, 12 pages.
Office Action for U.S. Appl. No. 13/952,467 dated Jan. 15, 2016, 22 pages.
Office Action for U.S. Appl. No. 14/194,499 dated May 18, 2016, 10 pages.
Office Action for U.S. Appl. No. 14/207,430 dated Oct. 15, 2015, 57 pages.
Office Action for U.S. Appl. No. 14/207,430 dated Mar. 10, 2016, 78 pages.
Office Action for U.S. Appl. No. 14/207,430 dated Jul. 25, 2016, 79 pages.
Office Action for U.S. Appl. No. 14/213,953 dated Nov. 9, 2015, 20 pages.
Office Action for U.S. Appl. No. 14/383,079 dated May 10, 2016, 7 pages.
Office Action for U.S. Appl. No. 14/383,079 dated Aug. 4, 2015, 11 pages.
Office Action for U.S. Appl. No. 14/588,202 dated May 10, 2016, 8 pages.
Office Action for U.S. Appl. No. 14/588,202 dated Sep. 11, 2015, 9 pages.
Office Action for U.S. Appl. No. 14/613,301 dated Feb. 4, 2016, 42 pages.
Office Action for U.S. Appl. No. 14/613,301 dated Mar. 31, 2015, 58 pages.
Office Action for U.S. Appl. No. 14/613,301 dated Jul. 31, 2015, 26 pages.
Advisory Action dated Jun. 8, 2012 for U.S. Appl. No. 12/835,704 filed on Jul. 13, 2010.
Avila a., et al., "Switching in Coplanar Amorphous Hydrogenated Silicon Devices," Solid-State Electronics, 2000, vol. 14 (1), pp. 17-27.
Cagli C., et al., "Evidence for Threshold Switching in the Set Process of Nio-based Rram and Physical Modeling for Set, Reset, Retention and Disturb Prediction", 2008 IEEE International Electron Devices Meeting (IEDM), Dec. 15-17, 2008, pp. 1-4, San Francisco, CA, USA.
Chang P.H., at al., "Aluminum Spiking at Contact Windows in Al/Ti-13 W/Si," Applied Physics Letters, 1988, Vol. 52 (4), pp. 272-274.
Chen Y., et al., "Nanoscale Molecular-switch Crossbar Circuits," Nanotechnology, 2003, vol. 14, pp. 462-468.
Chinese Office Action (English Translation) for Chinese Application No. 201180050941.0 dated Apr. 3, 2015, 8 pages.
Chinese Office Action (English Translation) for Chinese Application No. 201280027066.9 dated Nov. 23, 2015, 6 pages.
Chinese Office Action (English Translation) for Chinese Application No. 201110195933.7 dated Jul. 31, 2014, 4 pages.
Chinese Office Action (English Translation) for Chinese Application No. 201110195933.7 dated May 18, 2015, 4 pages.
Chinese Office Action (English Translation) for Chinese Application No. 201180050941.0 dated Dec. 9, 2015, 5 pages.
Chinese Office Action (with English Translation) for Chinese Application No. 201280027066.9 dated Jul. 4, 2016, 5 pages.
Chinese Office Action (with English Translation) for Chinese Application No. 201290000773.4 dated Jun. 9, 2014, 3 pages.
Chinese Seach Report (English Translation) for Chinese Application No. 201180050941.0 dated Mar. 25, 2015, 1 page.
Chinese Search Report (English Translation) for Chinese Application No. 201280027066.9 dated Nov. 13, 2015, 2 pages.
Choi J.W., "Bistable [2]Rotaxane Based Molecular Electronics: Fundamentals and Applications", Dissertation, Chapter 3, California Institute of Technology, Pasadena, 2007, pp. 79-120. Retrieved from the Internet.
Chou S.Y., et al., "Imprint Lithography With 25-Nanometer Resolution," Science, 1996, vol. 272, pp. 85-87.
Collier C.P., et al., "Electronically Configurable Molecular-based Logic Gates ," Science, 1999, vol. 285 (5426), pp. 391-395.
Corrected Notice of Allowability dated Nov. 20, 2014 for U.S. Appl. No. 13/594,665, 5 pages.
Corrected Notice of Allowability dated Jun. 15, 2016 for U.S. App. No. 13/952,467, 10 pages.
Corrected Notice of Allowability dated Oct. 1, 2013 for U.S. Appl. No. 13/733,828, filed d Jan. 2, 2013.
Corrected Notice of Allowance dated Jan. 11, 2013 for U.S. Appl. No. 12/861,666 dated Aug. 23, 2010.
Dehon A., "Array-Based Architecture for FET-Based, Nanoscale Electronics," IEEE Transactions on Nanotechnology, 2003, vol. 2 (1), pp. 23-32.

(56) References Cited

OTHER PUBLICATIONS

Del Alamo J., et al., "Operating limits of Al-alloyed High-low Junction for BSF Solar Cells," Solid-State Electronics, 1981, vol. 24, pp. 415-420.
Den Boer W., "Threshold Switching in Hydrogenated Amorphous Silicon," Applied Physics Letters, 1982, vol. 40, pp. 812-813.
Dey S.K., "Electrothermal Model of Switching in Amorphous Silicon Films," Journal of Vacuum Science & Technology, 1980, vol. 17 (1), pp. 445-448.
Dong Y., et al., "Si/a-Si Core/Shell Nanowires as Nonvolatile Crossbar Switches," Nano Letters, 2008, vol. 8 (2), pp. 386-391.
European Office Action for Application No. 11005649.6 dated Dec. 1, 2014, 2 pages.
European Office Action for Application No. 11005649.6 dated Nov. 17, 2015, 5 pages.
European Office Action for Application No. EP11005207.3 dated Aug. 8, 2012, 4 pages.
European Search Report for Application No. EP09819890.6 dated Mar. 27, 2012.
European Search Report for Application No. EP11005207.3 dated Oct. 12, 2011.
European Search Report for Application No. EP14000949, dated Jun. 4, 2014, 7 pages.
European Search Report for European Application No. EP11005649 dated Oct. 15, 2014, 2 pages.
Ex parte Quayle Action dated May 8, 2012 for U.S. Appl. No. 12/826,653, filed Jun. 29, 2010.
Final Office Action dated Jun. 29, 2016 for U.S. Appl. No. 14/692,677, 21 pages.
Final Office Action for U.S. Appl. No. 14/612,025 dated Jun. 14, 2016, 7 pages.
Final Office Action dated Feb. 1, 2016 for U.S. Appl. No. 14/573,817.
Final Office Action dated May 20, 2016 for U.S. Appl. No. 14/253,796.
Final Office Action dated Aug. 13, 2014 for U.S. Appl. No. 13/525,096 filed Jun. 15, 2012.
Gangopadhyay S., et al., "Memory Switching in Sputtered Hydrogenated Amorphous Silicon (a-Si:H)," Japanese Journal of Applied Physics, 1985, vol. 24 (10), pp. 1363-1364.
Goronkin H., et al., High-Performance Emerging Solid-State Memory Technologies, MRS Bulletin, Nov. 2004, pp. 805-813. Retrieved from the Internet.
Hajto J., et al., "Electronic Switching in Amorphous-Semiconductor Thin Films," Amorphous & Microcrystalline Semiconductor Devices: Materials and Device Physics, Chapter 14, 1992, pp. 640-701, vol. 2, Artech House, Inc.
Hajto J., et al., "Analogue Memory and Ballistic Electron Effects in Metal-amorphous Silicon Structures," Philosophical Magazine, 1991, vol. 63 (1), pp. 349-36p.
Hajto J., et al., "The Programmability of Amorphous Silicon Analogue Memory Elements," Materials Research Society Symposium Proceedings, 1990, vol. 192, pp. 405-410.
Holmes A.J., et al., "Design of Analogue Synapse Circuits using Non-Volatile a-Si:H Memory Devices", Proceedings of ISCAS, 1994, pp. 351-354.
Hu J., et al., "AC Characteristics of Cr/p. sup.+a-Si:H/V Analog Switching Devices," IEEE Transactions on Electron Devices, 2000, vol. 47 (9), pp. 1751-1757.
Hu X.Y., et al., "Write Amplification Analysis in Flash-based Solid State Drives", SYSTOR'09; 20090504-20090406, May 4, 2009, pp. 1-9.
Hu., et al., "Area-Dependent Switching in Thin Film-Silicon Devices," Materials Research Society Symposium Proceedings, 2003, vol. 762, pp. A 18.3.1-A 18.3.6.
Hu., et al. "Switching and Filament Formation in hot-wire CVD p-type a-Si:H devices," Thin Solid Films, Science . Direct, 2003, vol. 430, pp. 249-252.
Hudgens S., et al., "Overview of Phase-Change Chalcogenide Nonvolatile Memory Technology", MRS Bulletin, Nov. 2004, pp. 829-832. Retrieved from the Internet.
Notice of Allowance dated Dec. 19, 2014 for U.S. Appl. No. 13/529,985, 9 pgs.
Notice of Allowance dated Jul. 1, 2016 for U.S. Appl. No. 14/213,953, 96 pages.
Notice of Allowance dated Jul. 17, 2014 for U.S. Appl. No. 12/861,432, 25 pages.
Notice of Allowance dated Aug. 28, 2015 for U.S. Appl. No. 14/573,770, 23 pages.
Notice of Allowance for U.S. Appl. No. 14/509,967 dated Feb. 17, 2016, 18 pages.
Notice of Allowance for U.S. Appl. No. 14/509,967 dated Jun. 6, 2016, 96 pages.
Notice of Allowance for U.S. Appl. No. 14/213,953 dated Feb. 16, 2016, 21 pages.
Notice of Allowance for U.S. Appl. No. 14/611,022 dated Feb. 12, 2016, 13 pages.
Notice of Allowance for U.S. Appl. No. 14/611,022 dated Jun. 8, 2016, 57 pages.
Notice of Allowance for U.S. Appl. No. 14/611,022 dated Sep. 10, 2015, 13 pages.
Notice of Allowance for U.S. Appl. No. 14/612,025 dated Jul. 22, 2015, 25 pages.
Notice of Allowance for U.S. Appl. No. 13/912,136 dated Aug. 3, 2015, 15 pages.
Notice of Allowance for U.S. Appl. No. 13/952,467 dated May 20, 2016, 19 pages.
Notice of Allowance for U.S. Appl. No. 14/027,045 dated Jun. 9, 2015, 14 pages.
Notice of Allowance for U.S. Appl. No. 14/383,079 dated Jan. 4, 2016, 27 pages.
Notice of Allowance for U.S. Appl. No. 14/588,202 dated Jan. 20, 2016, 15 pages.
Notice of Allowance for U.S. Appl. No. 14/887,050 dated Jun. 22, 2016, 13 pages.
Notice of Allowance for U.S. Appl. No. 14/946,367 dated Jul. 13, 2016, 23 pages.
Notice of Allowance dated Sep. 4, 2014 for U.S. Appl. No. 13/761,132 filed Feb. 6, 2013.
Notice of Allowance dated Oct. 5, 2011 for U.S. Appl. No. 12/940,920 filed Nov. 5, 2010.
Notice of Allowance dated Feb. 6, 2012 for U.S. Appl. No. 12/835,699 filed Jul. 13, 2010.
Notice of Allowance dated Feb. 6, 2013 for U.S. Appl. No. 13/118,258 filed May 27, 2011.
Notice of Allowance dated Aug. 8, 2013 for U.S. Appl. No. 13/733,828 filed Jan. 3, 2013.
Notice of Allowance dated Jan. 8, 2013 for U.S. Appl. No. 12/814,410 filed Jun. 11, 2010.
Notice of Allowance dated Oct. 8, 2013 for U.S. Appl. No. 13/769,152 filed Feb. 15, 2013.
Notice of Allowance dated Oct. 8, 2013 for U.S. Appl. No. 13/905,074 filed May 29, 2013.
Notice of Allowance dated Apr. 9, 2013 for U.S. Appl. No. 13/748,490 filed Jan. 23, 2013.
Notice of Allowance dated Sep. 9, 2014 for U.S. Appl. No. 13/620,012 filed Sep. 14, 2012.
Notice of Allowance dated Sep. 9, 2014 for U.S. Appl. No. 13/870,919 filed Apr. 25, 2013.
Notice of Allowance dated Jan. 11, 2016 for U.S. Appl. No. 14/613,299.
Notice of Allowance dated Jan. 20, 2016 for U.S. Appl. No. 14/034,390.
Notice of Allowance dated Oct. 10, 2013 for U.S. Appl. No. 13/452,657 filed Apr. 20, 2012.
Notice of Allowance dated Jan. 11, 2013 for U.S. Appl. No. 12/894,087 filed Sep. 29, 2010.
Notice of Allowance dated May 11, 2012 for U.S. Appl. No. 12/939,824 filed Nov. 4, 2010.
Notice of Allowance dated Mar. 12, 2012 for U.S. Appl. No. 12/913,719 filed Oct. 27, 2010.

(56) References Cited

OTHER PUBLICATIONS

Notice of Allowance dated Nov. 13, 2013 for U.S. Appl. No. 13/461,725, filed May 1, 2012.
Notice of Allowance dated Nov. 14, 2012 for U.S. Appl. No. 12/861,666 filed Aug. 23, 2010.
Notice of Allowance dated Nov. 14, 2012 for U.S. Appl. No. 13/532,019 filed Jun. 25, 2012.
Notice of Allowance dated Mar. 15, 2013 for U.S. Appl. No. 12/894,098 filed Sep. 29, 2010.
Notice of Allowance dated Jan. 16, 2014 for U.S. Appl. No. 13/921,157 filed Jun. 18, 2013.
Notice of Allowance dated Oct. 16, 2013 for U.S. Appl. No. 13/174,264 filed Jun. 30, 2011.
Notice of Allowance dated Apr. 17, 2012 for U.S. Appl. No. 13/158,231 filed Jun. 10, 2011.
Notice of Allowance dated Jan. 17, 2014 for U.S. Appl. No. 13/725,331 filed Dec. 21, 2012.
Notice of Allowance dated Mar. 17, 2014 for U.S. Appl. No. 13/592,224 filed Aug. 22, 2012.
Notice of Allowance dated May 17, 2013 for U.S. Appl. No. 13/290,024.
Notice of Allowance dated Sep. 17, 2013 for U.S. Appl. No. 13/679,976 filed Nov. 16, 2012.
Notice of Allowance dated Sep. 17, 2014 for U.S. Appl. No. 13/960,735 filed Aug. 6, 2013.
Notice of Allowance dated Sep. 17, 2014 for U.S. Appl. No. 13/462,653 filed May 2, 2012.
Notice of Allowance dated Sep. 18, 2012 for U.S. Appl. No. 12/900,232 filed Oct. 7, 2010.
Notice of Allowance dated Sep. 18, 2014 for U.S. Appl. No. 13/920,021 filed Jun. 17, 2013.
Office Action for U.S. Appl. No. 14/887,050 dated Mar. 11, 2016, 12 pages.
Office Action for U.S. Appl. No. 15/046,172 dated Apr. 20, 2016, 8 pages.
Office Action dated Apr. 1, 2013 for U.S. Appl. No. 13/174,077 filed Jun. 30, 2011.
Office Action dated Aug. 1, 2012 for U.S. Appl. No. 12/894,098 filed Sep. 29, 2010.
Office Action dated Mar. 1, 2012 for U.S. Appl. No. 12/835,704 filed Jul. 13, 2010.
Office Action dated Aug. 2, 2013 for U.S. Appl. No. 13/594,665 filed Aug. 24, 2012.
Office Action dated Sep. 2, 2014 for U.S. Appl. No. 13/705,082, 41 pages.
Office Action dated Apr. 3, 2014 for U.S. Appl. No. 13/870,919 filed Apr. 25, 2013.
Office Action dated Oct. 3, 2013 for U.S. Appl. No. 13/921,157 filed Jun. 18, 2013.
Office Action dated Apr. 5, 2012 for U.S. Appl. No. 12/833,898 filed Jul. 9, 2010.
Office Action dated Oct. 5, 2011 for U.S. Appl. No. 11/875,541 filed Oct. 19, 2007.
Office Action dated Apr. 6, 2015 for U.S. Appl. No. 14/034,390 filed Sep. 23, 2013.
Office Action dated Dec. 6, 2013 for U.S. Appl. No. 13/564,639 filed Aug. 1, 2012.
Office Action dated Dec. 6, 2013 for U.S. Appl. No. 13/960,735 filed Aug. 6, 2013.
Office Action dated Feb. 6, 2014 for U.S. Appl. No. 13/434,567 filed Mar. 29, 2012.
Office Action dated Mar. 6, 2013 for U.S. Appl. No. 13/174,264 filed Jun. 30, 2011.
Office Action dated Mar. 6, 2013 for U.S. Appl. No. 13/679,976 filed Nov. 16, 2012.
Office Action dated Sep. 6, 2011 for U.S. Appl. No. 12/582,086 filed Oct. 20, 2009.
Office Action dated Dec. 7, 2012 for U.S. Appl. No. 13/436,714 filed Mar. 30, 2012.
Office Action dated Mar. 7, 2013 for U.S. Appl. No. 13/651,169 filed Oct. 12, 2012.
Office Action dated May 7, 2013 for U.S. Appl. No. 13/585,759 filed Aug. 14, 2012.
Office Action dated Jan. 8, 2014 for U.S. Appl. No. 12/861,432 filed Aug. 23, 2010.
Office Action dated Jun. 8, 2012 for U.S. Appl. No. 11/875,541 filed Oct. 19, 2007.
Office Action dated Aug. 9, 2013 for U.S. Appl. No. 13/764,710 filed Feb. 11, 2013.
Office Action dated Jul. 9, 2013 for U.S. Appl. No. 13/447,036 filed Apr. 13, 2012.
Office Action dated Jul. 9, 2014 for U.S. Appl. No. 14/166,691 filed Jan. 28, 2014.
Office Action dated Oct. 9, 2012 for U.S. Appl. No. 13/417,135 filed Mar. 9, 2012.
Office Action dated Jan. 10, 2014 for U.S. Appl. No. 13/920,021 filed Jun. 17, 2013.
Office Action dated Apr. 11, 2014 for U.S. Appl. No. 13/143,047 filed Jun. 30, 2011.
Office Action dated Feb. 11, 2014 for U.S. Appl. No. 13/620,012 filed Sep. 14, 2012.
Office Action dated Jul. 11, 2013 for U.S. Appl. No. 13/764,698 filed Feb. 11, 2013.
Office Action dated Sep. 11, 2014 for U.S. Appl. No. 13/739,283 filed Jan. 11, 2013.
Office Action dated Aug. 12, 2013 for U.S. Appl. No. 13/077,941 filed Mar. 31, 2011.
Office Action dated Aug. 12, 2016 for U.S. Appl. No. 14/667,346, 27 pages.
Office Action dated Mar. 12, 2014 for U.S. Appl. No. 13/167,920 filed Jun. 24, 2011.
Office Action dated Sep. 12, 2014 for U.S. Appl. No. 13/426,869 filed Mar. 22, 2012.
Office Action dated Sep. 12, 2014 for U.S. Appl. No. 13/756,498.
Office Action dated Dec. 3, 2015 for U.S. Appl. No. 14/253,796.
Office Action dated Feb. 13, 2014 for U.S. Appl. No. 13/174,077 filed Jun. 30, 2011.
Office Action dated Aug. 12, 2016 for U.S. Appl. No. 14/613,301, 43 pages.
Office Action dated Mar. 14, 2012 for U.S. Appl. No. 12/815,369 filed Jun. 14, 2010.
Office Action dated Mar. 14, 2014 for U.S. Appl. No. 12/835,704 filed Jul. 13, 2010.
Office Action dated Apr. 15, 2016 for U.S. Appl. No. 14/597,151.
Office Action dated Apr. 16, 2012 for U.S. Appl. No. 12/834,610 filed Jul. 12, 2010.
Office Action dated Jan. 16, 2014 for U.S. Appl. No. 13/739,283 filed Jan. 11, 2013.
Office Action dated May 16, 2012 for U.S. Appl. No. 12/815,318 filed Jun. 14, 2010.
Office Action dated Oct. 16, 2012 for U.S. Appl. No. 12/861,650 filed Aug. 23, 2010.
Office Action dated Apr. 17, 2012 for U.S. Appl. No. 12/814,410 filed Jun. 11, 2010.
Office Action dated Feb. 17, 2011 for U.S. Appl. No. 12/913,719 filed Oct. 27, 2010.
Office Action dated Jun. 17, 2014 for U.S. Appl. No. 14/072,657 filed Nov. 5, 2013.
Office Action for U.S. Appl. No. 13/733,843 dated Apr. 17, 2015, 15 pages.
Office Action for U.S. Appl. No. 14/306,093 dated Jan. 5, 2015, 13 pages.
Office Action for U.S. Appl. No. 14/306,093 dated Aug. 24, 2015, 18 pages.
European Office Action for European Patent Application No. 11870128.3 dated Apr. 2, 2015, 5 pages.
European Search Report for European Application No. EP14000951 dated Mar. 2, 2015, 7 pages.
Office Action for U.S. Appl. No. 13/189,401 dated Jan. 20, 2015, 13 pages.
Office Action for U.S. Appl. No. 14/188,622 dated Oct. 7, 2015, 13 pages.

(56) References Cited

OTHER PUBLICATIONS

Office Action for U.S. Appl. No. 14/188,622 dated Feb. 6, 2015, 9 pages.
Office Action for U.S. Appl. No. 13/910,402 dated Aug. 29, 2014, 11 pages.
Office Action for U.S. Appl. No. 13/733,843 dated Sep. 2, 2015, 12 pages.
Office Action for U.S. Appl. No. 13/189,401 dated Sep. 22, 2014, 14 pages.
European Search Report for Application No. EP11005207.3 of Oct. 12, 2011, 5 pages.
Office Action dated Mar. 17, 2015 for U.S. Appl. No. 14/573,770.
Office Action dated Apr. 19, 2011 for U.S. Appl. No. 12/582,086, filed Oct. 20, 2009.
Office Action dated Aug. 19, 2013 for U.S. Appl. No. 13/585,759, filed Aug. 14, 2012.
Office Action dated Jun. 19, 2012 for U.S. Appl. No. 13/149,757, filed May 31, 2011.
Office Action dated Mar. 19, 2013 for U.S. Appl. No. 13/465,188, filed May 7, 2012.
Office Action dated Mar. 19, 2013 for U.S. Appl. No. 13/564,639, filed Aug. 1, 2012.
Office Action dated May 20, 2013 for U.S. Appl. No. 13/725,331, filed Dec. 21, 2012.
Office Action dated Nov. 20, 2012 for U.S. Appl. No. 13/149,653, filed May 31, 2011.
Office Action dated Sep. 20, 2013 for U.S. Appl. No. 13/481,600, filed May 25, 2012.
Office Action dated Mar. 21, 2014 for U.S. Appl. No. 13/447,036, filed Apr. 13, 2012.
Office Action dated May 31, 2014 for U.S. Appl. No. 13/764,698, filed Feb. 11, 2013.
Office Action dated Sep. 21, 2011 for U.S. Appl. No. 12/835,704, filed Jul. 13, 2010.
Office Action dated Jul. 22, 2010 for U.S. Appl. No. 11/875,541, filed Oct. 19, 2007.
Office Action dated Jul. 22, 2011 for U.S. Appl. No. 12/913,719, filed Oct. 27, 2010.
Office Action dated Sep. 22, 2013 for U.S. Appl. No. 13/189,401, filed Jul. 22, 2011.
Office Action dated May 23, 2013 for U.S. Appl. No. 13/592,224, filed Aug. 22, 2012.
Office Action dated Aug. 24, 2011 for U.S. Appl. No. 12/835,699, filed Jul. 13, 2010.
Office Action dated Apr. 25, 2012 for U.S. Appl. No. 13/149,653, filed May 31, 2011.
Office Action dated Apr. 25, 2014 for U.S. Appl. No. 13/761,132, filed Feb. 6, 2013.
Office Action dated Jan. 25, 2012 for U.S. Appl. No. 12/861,650, filed Aug. 23, 2010.
Office Action dated Oct. 25, 2012 for U.S. Appl. No. 13/461,725, filed May 1, 2012.
Office Action dated Sep. 25, 2013 for U.S. Appl. No. 13/194,479, filed Jul. 29, 2011.
Office Action dated Nov. 26, 2012 for U.S. Appl. No. 13/156,232.
Office Action dated Aug. 27, 2013 for U.S. Appl. No. 13/436,714, filed Mar. 30, 2012.
Office Action dated Dec. 27, 2013 for U.S. Appl. No. 13/525,096, filed Jun. 15, 2012.
Office Action dated Mar. 27, 2012 for U.S. Appl. No. 13/314,513, filed Dec. 8, 2011.
Office Action dated Jan. 29, 2014 for U.S. Appl. No. 13/586,815, filed Aug. 15, 2012.
Office Action dated Jul. 29, 2013 for U.S. Appl. No. 13/466,008, filed May 7, 2012.
Office Action dated Mar. 29, 2013 for U.S. Appl. No. 12/861,432, filed Aug. 23, 2010.
Office Action dated Jul. 30, 2012 for U.S. Appl. No. 12/900,232, filed Oct. 7, 2010.
Office Action dated Jun. 30, 2014 for U.S. Appl. No. 13/531,449, filed Jun. 22, 2012.
Office Action dated Mar. 30, 2011 for U.S. Appl. No. 11/875,541, filed Oct. 19, 2007.
Office Action dated Sep. 30, 2013 for U.S. Appl. No. 13/189,401, filed Jul. 22, 2011.
Office Action dated Sep. 30, 2013 for U.S. Appl. No. 13/462,653 filed May 2, 2012.
Office Action dated Apr. 8, 2016 for U.S. Appl. No. 14/573,770.
Office Action dated May 20, 2016 for U.S. Appl. No. 14/613,299.
Office Action dated Jul. 9, 2015 for U.S. Appl. No. 14/573,817.
Owen A.E., et al., "Electronic Switching in Amorphous Silicon Devices: Properties of the Conducting Filament", Proceedings of 5th International Conference on Solid-State and Integrated Circuit Technology, IEEE, 1998, pp. 330-833.
Owen A.E., et al., "Memory Switching in Amorphous Silicon Devices," Journal of Non- Crystalline Solids, 1983, vol. 50-60 (Pt.2), pp. 1273-1280.
Owen A.E., et al., "New Amorphous-Silicon Electrically Programmable Nonvolatile Switching Device," Solid-State and Electron Devices, IEEE Proceedings, 1982, Vol. 129 (Pt. 1), pp. 51-54.
Owen A.E., et al., "Switching in Amorphous Devices," International Journal of Electronics, 1992, vol. 73 (5), pp. 897-906.
Rose M.J., et al., "Amorphous Silicon Analogue Memory Devices," Journal of Non-Crystalline Solids, 1989, vol. 115, pp. 168-170.
Russo U., et al., "Self-Accelerated Thermal Dissolution Model for Reset Programming in Unipolar Resistive-Switching Memory (RRAM) Devices," IEEE Transactions on Electron Devices, 2009, Vol. 56 (2), pp. 193-200.
Scott J.C., "Is There an Immortal Memory?," American Association for the Advancement of Science, 2004, vol. 304 (5667), pp. 62-63.
Shin W., et al., "Effect of Native Oxide on Polycrystalline Silicon CMP," Journal of the Korean Physical Society, 2009, vol. 54 (3), p. 1077-1081.
Stikeman A., Polymer Memory- The Plastic Path to Better Data Storage, Technology Review, Sep. 2002, pp. 31. Retrieved from the Internet.
Suehle J.S., et al., "Temperature Dependence of Soft Breakdown and Wear-out in Sub-3 Nm Si02 Films", 38th Annual International Reliability Physics Symposium, San Jose, California, 2000, pp. 33-39.
Sune J., et al., "Nondestructive Multiple Breakdown Events in Very Thin Si02 Films," Applied Physics Letters, 1989, vol. 55, pp. 128-130.
Terabe K., et al., "Quantized Conductance Atomic Switch," Nature, 2005, vol. 433, pp. 47-50.
Waser R., et al., "Nanoionics-based Resistive Switching Memories," Nature Materials, 2007, vol. 6, pp. 833-835.
Written Opinion for Application No. PCT/US2009/060023, dated May 18, 2010, 3 pages.
Written Opinion for Application No. PCT/US2009/061249, dated May 19, 2010, 3 pages.
Written Opinion for Application No. PCT/US2011/040090, dated Feb. 17, 2012, 6 pages.
Written Opinion for Application No. PCT/US2011/045124, dated May 29, 2012, 5 pages.
Written Opinion for Application No. PCT/US2011/046036, dated Feb. 23, 2012, 4 pages.
Yin S., "Solution Processed Silver Sulfide Thin Films for Filament Memory Applications", Technical Report No. UCB/EECS-2010-166, Dec. 17, 2010, Electrical Engineering and Computer Sciences, University of California at Berkeley. Retrieved from the Internet.
Yuan H.C., et al., "Silicon Solar Cells with Front Hetero-Contact and Aluminum Alloy Back Junction", NREL Conference Paper CP-520-42566, 33rd IEEE Photovoltaic Specialists Conference, May 11-16, 2008, National Renewable Energy Laboratory, San Diego, California.
Ankovych S., et al., "Nanoimprint Lithography: Challenges and Prospects," Nanotechnology, 2001, vol. 12, pp. 1-95.
Office Action dated Aug. 23, 2016 for U.S. Appl. No. 14/613,585, 9 pages.
Notice of Allowance dated Sep. 14, 2016 for U.S. Appl. No. 14/588,202, 119 pages.

(56) References Cited

OTHER PUBLICATIONS

Notice of Allowance dated Oct. 5, 2016 for U.S. Appl. No. 14/887,050, 113 pages.
Notice of Allowance dated Oct. 7, 2016 for U.S. Appl. No. 14/213,953, 43 pages.
Japanese Office Action dated Aug. 9, 2016 for Japanese Application No. 2014-513700, 8 pages (including translation).
Chinese Office Action dated Sep. 1, 2016 for Chinese Application No. 201380027469.8, 8 pages (including translation).
Notice of Allowance for U.S. Appl. No. 13/952,467 dated Sep. 28, 2016, 128 pages.
Notice of Allowance for U.S. Appl. No. 15/046,172 dated Oct. 4, 2016, 116 pages.
Notice of Allowance for U.S. Appl. No. 14/612,025 dated Oct. 19, 2016, 108 pages.
Notice of Allowance for U.S. Appl. No. 14/509,967 dated Oct. 24, 2016, 42 pages.
Office Action for U.S. Appl. No. 14/597,151 dated Oct. 20, 2016, 52 pages.
Notice of Allowance for U.S. Appl. No. 14/611,022 dated Oct. 26, 2016, 41 pages.
Office Action for U.S. Appl. No. 14/588,136 dated Nov. 2, 2016, 132 pages.
Notice of Allowance for U.S. Appl. No. 14/692,677 dated Nov. 21, 2016, 97 pages.
Corrected Notice of Allowability dated Dec. 6, 2016 for U.S. Appl. No. 14/383,079, 33 pages.
Notice of Allowance for U.S. Appl. No. 14/194,499 dated Dec. 12, 2016, 125 pages.
International Search Report and Written Opinion for Application No. PCT/US2011/040362, dated Jan. 19, 2012, 7 pages.
International Search Report and Written Opinion for Application No. PCT/US2011/046035, dated Mar. 27, 2012, 6 pages.
International Search Report and Written Opinion for Application No. PCT/US2012/040232, dated Feb. 26, 2013, 7 pages.
International Search Report and Written Opinion for Application No. PCT/US2012/040242, dated Jan. 31, 2013, 3 pages.
International Search Report and Written Opinion for Application No. PCT/US2012/044077, dated Jan. 25, 2013, 3 pages.
International Search Report and Written Opinion for Application No. PCT/US20121045312, dated Mar. 29, 2013, 11 pages.
International Search Report and Written Opinion for Application No. PCT/US2013/042746, dated Sep. 6, 2013, 7 pages.
International Search Report and Written Opinion for Application No. PCT/US2013/054976, dated Dec. 16, 2013, 9 pages
International Search Report and Written Opinion for Application No. PCT/US2013/061244, dated Jan. 28, 2014, 8 pages.
International Search Report and Written Opinion for Application No. PCT/US2013/077628, dated Apr. 29, 2014, 12 pages.
International Search Report for Application No. PCT/US2009/060023, dated May 18, 2010, 3 pages.
International Search Report for Application No. PCT/US2009/061249, dated May 19, 2010, 3 pages.
International Search Report for Application No. PCT/US2011/040090, dated Feb. 17, 2012, 5 pages.
International Search Report for Application No. PCT/US2011/045124, dated May 29, 2012, 3 pages.
International Search Report for Application No. PCT/US2011/046036, dated Feb. 22, 2012, 3 pages.
Jafar M., et al., "Switching in Amorphous-silicon Devices," Physical Review, 1994, vol. 49 (19), pp. 611-615.
Japanese Office Action (English Translation) for Japanese Application No. 2011-153349 dated Feb. 24, 2015, 3 pages.
Japanese Office Action (English Translation) for Japanese Application No. 2013-525926 dated Mar. 3, 2015, 4 pages.
Japanese Office Action (English Translation) for Japanese Application No. 2014-513700 dated Jan. 12, 2016, 4 pages.
Japanese Search Report (English Translation) for Japanese Application No. 2013-525926 dated Feb. 9, 2015, 15 pages.
Japanese Search Report (English Translation) for Japanese Application No. 2011-153349 dated Feb. 9, 2015, 11 pages.
Japanese Search Report (English Translation) for Japanese Application No. 2014-513700 dated Jan. 14, 2016, 25 pages.
Jo S.H. et al., "High-Density Crossbar Arrays Based on a Si Memristive System", Supporting Information, 2009, pp. 1-4.
Jo S.H., et al., "A Silicon-Based Crossbar Ultra-High-Density Non-Volatile Memory", SSEL Annual Report, 2007.
Jo S.H., et al., "Ag/a-Si:H/c-Si Resistive Switching Nonvolatile Memory Devices," Nanotechnology Materials and Devices Conference, 2006, vol. 1, pp. 116-117.
Jo S.H., et al., "CMOS Compatible Nanoscale Nonvolatile Resistance Switching Memory," Nano Letters, 2008, vol. 8 (2), pp. 392-397.
Jo S.H., et al., "Experimental, Modeling and Simulation Studies of Nanoscale Resistance Switching Devices", 9.sup.th Conference on Nanotechnology, IEEE, 2009, pp. 493-495.
Jo S.H., et al., "High-Density Crossbar Arrays Based on a Si Memristive System," Nano Letters, 2009, vol. 9 (2), pp. 870-874.
Jo S: H. et al., "Nanoscale Memristive Devices for Memory and Logic Applications", Ph. D Dissertation, University of Michigan, 2010.
Jo S.H., et al., "Nanoscale Memristor Device as Synapse in Neuromorphic Systems," Nano Letters, 2010, vol. 10, pp. 1297-1301.
Jo S.H. et al., "Nonvolatile Resistive Switching Devices Based on Nanoscale Metal/Amorphous Silicon/Crystalline Silicon Junctions," Materials Research Society Symposium Proceedings, 2007, vol. 997.
Jo S.H., et al., "Programmable Resistance Switching in Nanoscale Two-Terminal Devices," Nano Letters, 2009, vol. 9 (1), pp. 496-500.
Jo S.H., et al., "Programmable Resistance Switching in Nanoscale Two-Terminal Devices," Supporting Information, Dec. 29, 2008, pp. 1-4, vol. 9., No. 1, Department of Electrical Engineering and Computer Science, the University of Michigan, Ann Arbor, Michigan.
Jo S.H., et al., "Si Memristive Devices Applied to Memory and Neuromorphic Circuits", Proceedings of 2010 IEEE International Symposium on Circuits and Systems, 2010, pp. 13-16.
Jo S.H., et al., "Si-Based Two-Terminal Resistive Switching Nonvolatile Memory", IEEE, 2008.
Kuk-Hwan Kim et al., "Nanoscale Resistive Memory with Intrinsic Diode Characteristics and Long Endurance," Applied Physics Letters, 2010, vol. 96, pp. 053106-1-053106-3.
Kund M., et al., "Conductive Bridging Ram (cbram): An Emerging Non-volatile Memory Technology Scalable to Sub 20nm", IEEE, 2005.
Le Comber P.G., et al., "The Switching Mechanism in Amorphous Silicon Junctions," Journal of Non-Crystalline Solids, 1985, vol. 77 & 78, pp. 1373-1382.
Le Comber P.G., "Present and Future Applications of Amorphous Silicon and Its Alloys," Journal of Non-Crystalline Solids, 1989, vol. 115, pp. 1-13.
Lee S.H., et al., "Full Integration and Cell Characteristics for 64Mb Nonvolatile PRAM", 2004 Symposium on VLSI Technology Digest of Technical Papers, IEEE, 2004, pp. 20-21.
Liu M., et al., "rFGA: CMOS-Nano Hybrid FPGA Using RRAM Components", IEEE CB3 N171nternational Symposium on Nanoscale Architectures, Anaheim, USA, Jun. 12-13, 2008, pp. 93-98.
Lu W., et al., "Nanoelectronics from the Bottom Up," Nature Materials, 2007, vol. 6, pp. 841-850.
Lu W., et al., "Supporting Information", 2008.
Marand H., et al., MESc. 5025 lecture notes: Chapter 7. Diffusion, University of Vermont. Retrieved from the Internet on Sep. 9, 2016. https://www.yumpu.com/en/document/view/31750386/diffusion-1-color.
Moopenn k et al., "Programmable Synaptic Devices for Electronic Neural Nets," Control and Computers, 1990, vol. 18 (2), pp. 37-41.
Muller D.A., et al., "The Electronic Structure at the Atomic Scale of Ultrathin Gate Oxides," Nature, 1999, vol. 399, pp. 758-761.

(56) References Cited

OTHER PUBLICATIONS

Muller G., et al., "Status and Outlook of Emerging Nonvolatile Memory Technologies", IEEE, 2004, pp. 567-570.
Newman R.C., "Defects in Silicon," Reports on Progress in Physics, 1982, vol. 45, pp. 1163-1210.
Notice of Allowance dated Nov. 26, 2013 for U.S. Appl. No. 13/481,696, 15 pages.
Notice of Allowance dated Dec. 16, 2014 for U.S. Appl. No. 12/835,704, 47 pages.

* cited by examiner

LOW TEMPERATURE P+ POLYCRYSTALLINE SILICON MATERIAL FOR NON-VOLATILE MEMORY DEVICE

CROSS-REFERENCE TO RELATED APPLICATIONS

The instant application claims priority to and is a divisional application of U.S. patent application Ser. No. 13/452,657 filed Apr. 20, 2012, which is hereby incorporated by reference for all purposes.

BACKGROUND

The present invention is related to switching devices. More particularly, the present invention provides a resistive switching device and a fabrication method compatible with conventional CMOS processes. Embodiments of the present invention have been applied to a non-volatile memory device. But it should be recognized that the present invention can have a much broader range of applicability.

The inventors of the present invention have recognized the success of semiconductor devices has been mainly driven by an intensive transistor down-scaling process. However, as field effect transistors (FETs) approach sizes less than 100 nm, physical problems such as short channel effect begin to hinder proper device operation. For transistor based memories, such as those commonly known as Flash memories, other performance degradations or problems may occur as device sizes shrink. With Flash memories, a high voltage is usually required for programming of such memories, however, as device sizes shrink, the high programming voltage can result in dielectric breakdown and other problems. Similar problems can occur with other types of non-volatile memory devices other than Flash memories.

The inventors of the present invention recognizes that many other types of non-volatile random access memory (RAM) devices have been explored as next generation memory devices, such as: ferroelectric RAM (Fe RAM); magneto-resistive RAM (MRAM); organic RAM (ORAM); phase change RAM (PCRAM); and others.

A common drawback with these memory devices include that they often require new materials that are incompatible with typical CMOS manufacturing. As an example of this, Organic RAM or ORAM requires organic chemicals that are currently incompatible with large volume silicon-based fabrication techniques and foundries. As another example of this, Fe-RAM and MRAM devices typically require materials using a high temperature anneal step, and thus such devices cannot be normally be incorporated with large volume silicon-based fabrication techniques.

Additional drawbacks with these devices include that such memory cells often lack one or more key attributes required of non-volatile memories. As an example of this, Fe-RAM and MRAM devices typically have fast switching (e.g. "0" to "1") characteristics and good programming endurance, however, such memory cells are difficult to scale to small sizes. In another example of this, for ORAM devices reliability of such memories is often poor. As yet another example of this, switching of PCRAM devices typically includes Joules heating and undesirably requires high power consumption.

From the above, improved semiconductor memory devices that can scale to smaller dimensions with reduced drawbacks are therefore desirable.

BRIEF SUMMARY OF THE PRESENT INVENTION

The present invention is related to switching devices. More particularly, the present invention provides a resistive switching device and a fabrication method compatible with conventional CMOS processes. Embodiments of the present invention have been applied to a resistive random access memory device, which is non-volatile. But it should be recognized that the present invention can have a much broader range of applicability.

In a specific embodiment, a method of forming a resistive switching device is provided. The method includes providing a substrate having a surface region. The substrate can comprises of a semiconductor material in a specific embodiment. A first dielectric material is formed overlying the surface region of the substrate and a first electrode structure is formed overlying the first dielectric material. In a specific embodiment, the first electrode structure comprises a first conductor material commonly used in a back end of process of CMOS fabrication. The method forms a polycrystalline silicon germanium material overlying the first electrode structure. In a specific embodiment, the polycrystalline silicon germanium material has a first p+ impurity characteristic. A polycrystalline silicon material is formed overlying the first electrode structure using the polycrystalline silicon germanium material as a seed layer. The polycrystalline silicon material is formed at a deposition temperature ranging from about 430 Degree Celsius to about 475 Degree Celsius. In a specific embodiment, the polycrystalline silicon material is characterized by a second p+ impurity characteristic. The method includes forming a switching material comprising an amorphous silicon material overlying the polycrystalline silicon material, and forming second electrode structure overlying the switching material The second electrode structure includes at least a portion comprising an active metal material in physical and electrical contact with the switching material. The resistive switching device is disposed in an N by M crossbar array in a specific embodiment, where N and M are integers (N≥1, M≥1), or other arrangements.

In a specific embodiment, a resistive switching device for a memory device is provided. The resistive switching device includes a first electrode, a second electrode. The second electrode includes a portion comprising an active conductive material. The resistive switching device includes a resistive switching material configured in an intersection region between the first electrode and the second electrode and configured to be in physical and electrical contact with the active conductive material. In a specific embodiment, the resistive switching device includes a buffer layer material comprising one or more silicon material having a p+ impurity characteristic disposed in between the first electrode and the resistive switching material. The buffer layer material is configured to provide a desirable switching behavior for the resistive switching device.

Many benefits can be achieved by ways of the present invention. Embodiment according to the present invention provide a method to form a polycrystalline silicon material having a desirable electrical properties at a deposition temperature of no greater than 450 Degree Celsius, well within a thermal budget to be formed ay in a backend of a CMOS processes. The dopant species (for example, boron species for a p doped) in the polycrystalline silicon material are activated during deposition and does not need an anneal process further simplify the fabrication process and enhance device yield. Additionally, the non-memory device can be fabricated using conventional semiconductor process without modification to the process equipment. Depending on the embodiment, one or more of these benefits can be realized. One skilled in the art would recognize other modifications, variations, and alternatives.

SUMMARY OF THE DRAWINGS

In order to more fully understand the present invention, reference is made to the accompanying drawings. Understanding that these drawings are not to be considered limitations in the scope of the invention, the presently described embodiments and the presently understood best mode of the invention are described with additional detail through use of the accompanying drawings in which.

DETAILED DESCRIPTION OF THE PRESENT INVENTION

Embodiments according to the present invention are related to switching devices. More particularly, the present invention provides a structure for resistive switching device and a fabrication method compatible with conventional CMOS processes. Embodiments of the present invention have been applied to a resistive random access memory device, which is non-volatile. But it should be recognized that embodiments according to the present invention can have a much broader range of applicability.

The terms "Top" or Bottom" are for the purpose of illustration only and should not be construed to be limiting.

Resistive switching devices usually comprise of a bottom electrode, a top electrode, and a resistive switching material sandwiched between the top electrode and the bottom electrode. Resistive switching devices using amorphous silicon or certain metal oxide, for example, zinc oxide as the resistive switching material require a buffer layer between the resistive switching material and the bottom electrode material. It is believed that switching phenomena in these devices are based on a filament structure derived from an active metal material from the top electrode formed in a portion of the resistive switching material to cause changes in a resistance characteristic of the material. The filament structure can determine the performance attributes of the resistive switching device, namely, data retention, endurance, and desirable switching characteristic, and others. The buffer layer is provided to ensure proper switching of the device under a predetermined range of switching voltage and current. Polycrystalline silicon material provides desired characteristics for the buffer layer such as desirable electric conductivity and inhibition of direct contact between the filament structure and the bottom electrode. The formation of the polycrystalline silicon material with dopant activation usually occurs at temperature greater than about 600 Degree Celsius for desirable electrical conductivity, as well known in the art.

The resistive switching device can be vertical integrated and fabricated in a backend of process for a CMOS device and should be fabricated at temperatures compatible with the underlying CMOS. Embodiments according to the present invention provide a device structure and a method to fabricate a resistive switching device at temperatures well within the thermal budget of the underlying CMOS devices.

Figure 1:
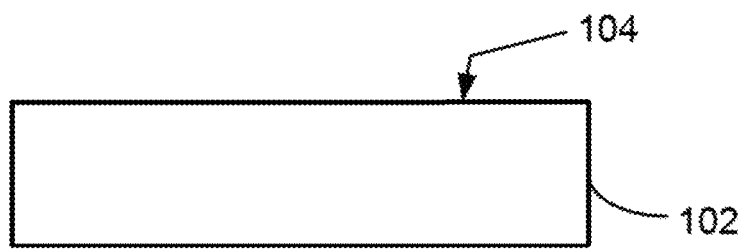
FIGS. 1-11 are simplified diagram illustrating a method of forming a resistive switching device for non-volatile memory device according to an embodiment of the present invention.

FIGS. 1-11 are simplified diagrams illustrating a method of forming a resistive switching device according to an embodiment of the present invention. As shown in FIG. 1, a semiconductor substrate 102 having a surface region 104 is provided. Semiconductor substrate 102 can be a single crystal silicon wafer, a silicon germanium material, a silicon on insulator (commonly called SOI) depending on the embodiment. In certain embodiments, semiconductor substrate 102 can have one or more MOS devices formed thereon. The one or more MOS devices can be controlling circuitry for the resistive switching device in a specific embodiment.

In various embodiments, a processor, or the like, may include resistive memory memories as described herein. Because the resistive memories are relatively non-volatile, devices such as processors, or the like using such memories may maintain state while power is not supplied to the processors. To a user, such capability would greatly enhance the power-on power-off performance of devices including such processors. Additionally, such capability would greatly reduce the power consumption of devices. In particular, because such memories are non-volatile, the processor need not draw power to refresh the memory states, as is common with CMOS type memories. Accordingly, embodiments of the present invention are directed towards processors or other logic incorporating these memory devices, devices (e.g. smart phones, network devices) incorporating such memory devices, and the like.

Figure 2:

As illustrate in FIG. 2, the method includes depositing a first dielectric material 202 overlying the semiconductor substrate. First dielectric material 202 can be silicon oxide, silicon nitride, a dielectric stack of alternating layers of silicon oxide and silicon nitride (for example, an ONO stack), a low K dielectric, a high K dielectric, or a combination, and others, depending on the application. First dielectric material 202 can be deposited using techniques such as chemical vapor deposition, including low pressure chemical vapor deposition, plasma enhanced chemical vapor deposition, atomic layer deposition (ALD), physical vapor deposition, including any combination of these, and others.

Figure 3:
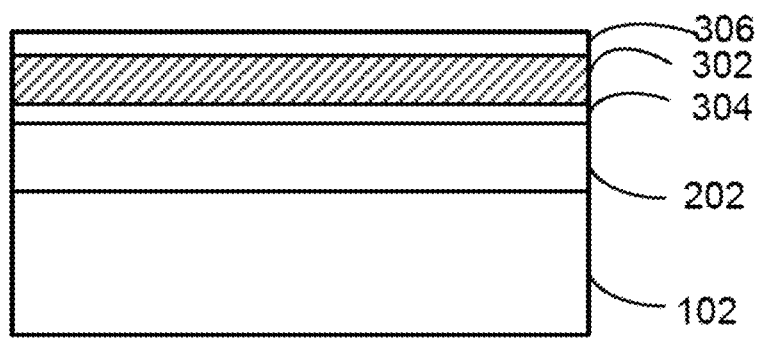

Referring to FIG. 3, the method includes depositing a first wiring material 302 overlying the first dielectric material. First wiring material 302 can be a suitable metal material including alloy materials, or a semiconductor material having a suitable conductivity characteristic. The metal material can be tungsten, aluminum, copper or silver, and others. These metal materials may be deposited using a physical vapor deposition process, chemical vapor deposition process, electroplating, or electroless deposition process, including any combinations of these, and others. The semiconductor material can be, for example, a suitably doped silicon material in certain embodiments. In certain embodiments, a first adhesion material 304 is first formed overlying the first dielectric material before deposition of the first wiring material to promote adhesion of the first wiring material to the first dielectric material. A diffusion barrier material 306 may also be formed overlying the metal material to prevent the metal material to contaminate other portions of the device in a specific embodiment. In other embodiments, diffusion barrier material 306 may be optional.

Figure 4:
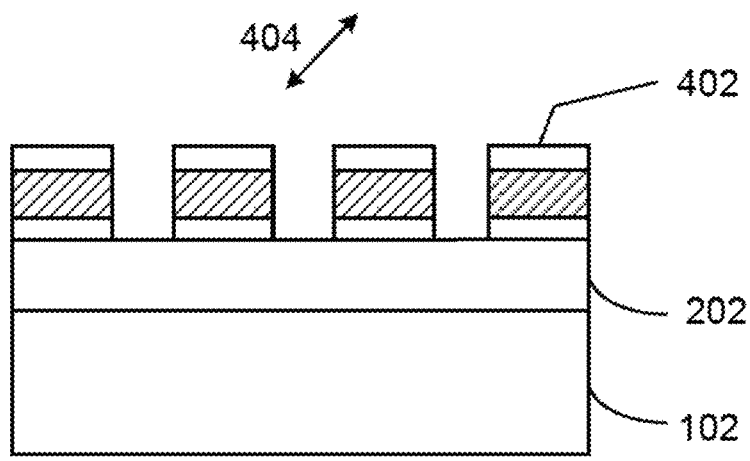
Figure 4A:
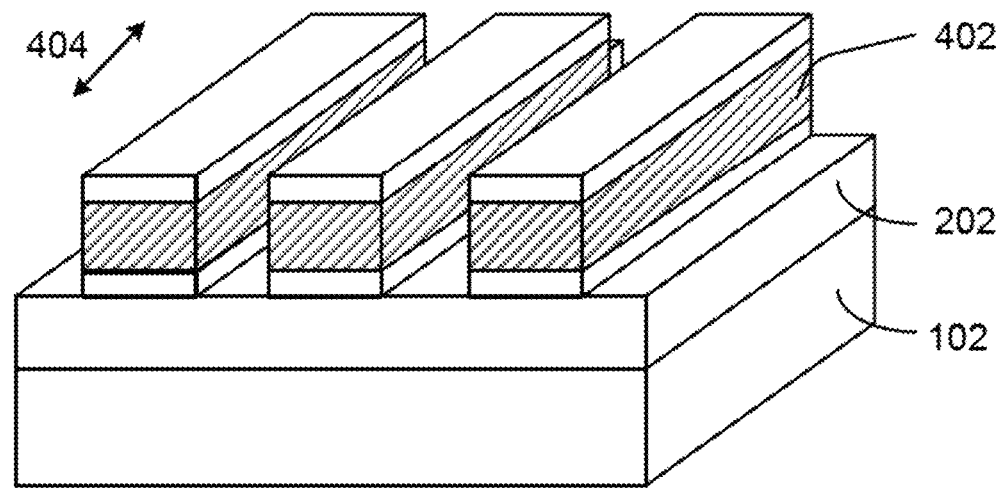
Figure 5:
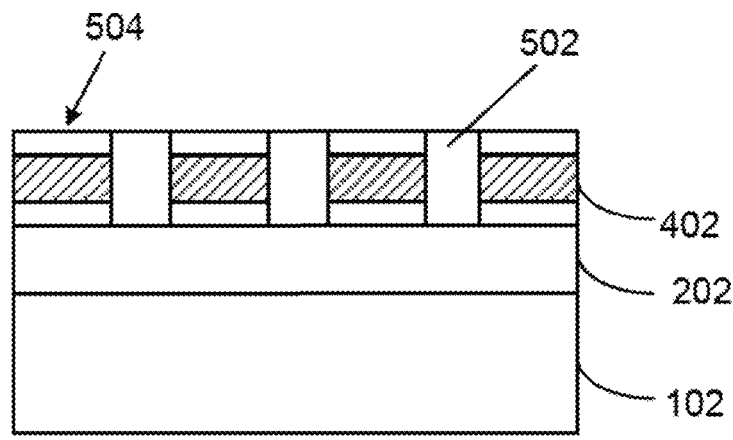
Figure 6:
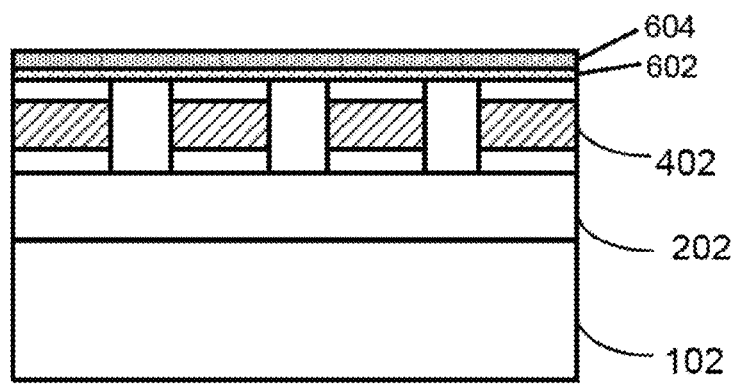

As shown in FIGS. 4 and 4A, the method subjects first wiring material 302 to a first pattern and etching process to form a first wiring structure 402 in a specific embodiment. First wiring structure 402 includes a plurality of first elongated structures configured to extend in a first direction 404 in a specific embodiment. In a specific embodiment, the method deposits a second dielectric material 502 overlying the first wiring structure. The second dielectric material can be silicon oxide, silicon nitride, a dielectric stack of alternating layers of silicon oxide and silicon nitride (for example, an ONO stack), a low K dielectric, a high K dielectric, or a combination, and others, depending on the application. Second dielectric material 502 can be subjected to a planarizing process to isolate the first wiring structure in a specific embodiment. As shown in FIG. 5, a surface region 504 of the diffusion barrier material is exposed.

In a specific embodiment, the method includes forming a polycrystalline silicon germanium material 602 overlying first wiring structure 402. Polycrystalline silicon germanium material 602 can be doped using a p+ impurity species in a specific embodiment. The p+ impurity species can be a boron bearing species, an aluminum bearing species, a gallium bearing species or an indium bearing species depending on the application. In a specific embodiment, the p+ impurity specie is provided using a boron bearing species. Depending on the embodiment, the polycrystalline silicon germanium material can be deposited overlying a nucleation material (not shown). The nucleation material can be a first silicon material deposited by a first chemical vapor deposition process using a silicon precursor such as silane, disilane, a suitable chlorosilane and a reducing species at a first deposition temperature. The first deposition temperature can range from about 420 Degree Celsius to about 475 Degree Celsius depending on the embodiment. The first silicon material can be doped or undoped, depending on the embodiment. Depending on the embodiment, the silicon germanium material can be deposited using silane, disilane, or a chlorosilane as a silicon precursor, germane (GeH4) as the germanium precursor by a second chemical vapor deposition process. The second chemical vapor deposition process can include low pressure chemical vapor deposition process, plasma enhanced chemical vapor deposition process, and others at a second deposition temperature. The p+ impurity species can be provided using a boron bearing species borane, diborane, or a boron halide, for example, boron chloride depending on the application. Second deposition temperature can range from about 420 Degree Celsius to about 475 Degree Celsius. In some embodiments, polycrystalline silicon germanium material 602 is on the order of approximately 75 nm.

Referring again to FIG. 6. The method includes forming a polycrystalline silicon material 604 overlying the first wiring structure using the polycrystalline silicon germanium material as a seed material. Depending on the embodiment, polycrystalline silicon material 604 may be formed using a third chemical vapor deposition process using silane, disilane, a chlorosilane in a reducing environment, for example hydrogen, and other suitable silicon precursors. The third chemical vapor deposition process can include low pressure chemical vapor deposition process, plasma enhanced chemical vapor deposition process, and others, at a third deposition temperature. Alternatively, polycrystalline silicon material 604 may be formed using a physical vapor deposition process from a suitable silicon target material. The polycrystalline silicon material may be doped using a p type impurity species to cause a p+ type impurity characteristic in the polycrystalline silicon material in a specific embodiment. The p+ type impurity species can be provided using a boron species, an aluminum species, a gallium species, or an indium species depending on the embodiment. In a specific embodiment, the p type impurity species is boron and may be co-deposited by using a boron bearing specie such as borane, diborane, or boron chloride with the silicon precursor in a chemical vapor deposition process in a specific embodiment. Third deposition temperature can range from about 430 Degree Celsius to about 470 Degree Celsius depending on the application.

Again depending in the application, the buffer layer comprising of nucleation material (for example, the first silicon material), the p+ polycrystalline silicon germanium material, and the p+ polycrystalline silicon material can be formed in a same process chamber without breaking vacuum by merely changing various gas flows (silicon precursor, germanium precursor, dopant species, and others) in a specific embodiment. In various embodiments polycrystalline silicon material 604 may be on the order of 75 nm, or the like. In some embodiments, the thicknesses of silicon material 602 and silicon material 604 may be similar, or different. In some embodiments, the thicknesses of these layers may be changed depending upon engineering requirements.

Figure 7:
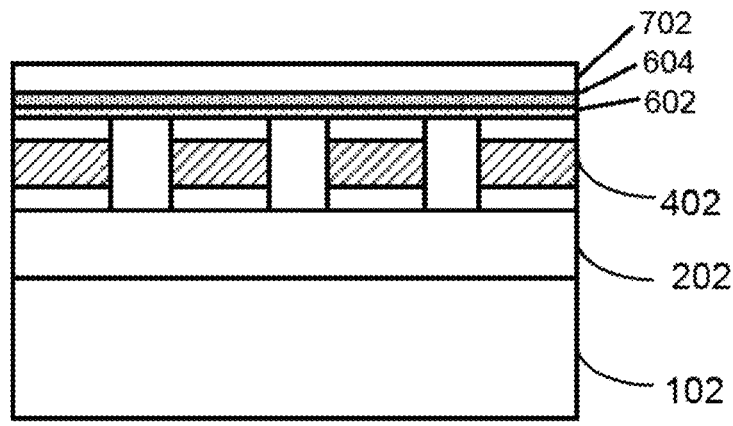

In a specific embodiment, the method includes forming a resistive switching material 702 overlying the p+ polycrystalline silicon material of the buffer material as illustrated in FIG. 7. The resistive switching material can be a second silicon material in a specific embodiment. The second silicon material can have an amorphous characteristic or a polycrystalline characteristic depending on the application. The second silicon material is not doped intentionally and has an intrinsic semiconductor characteristic in a specific embodiment. Deposition techniques for the second silicon material can include a fourth chemical vapor deposition process, a physical vapor deposition process, an atomic layer deposition (ALD) process, and others. The fourth chemical vapor deposition process can include low pressure chemical vapor deposition process, plasma enhanced chemical vapor deposition process, and others, using a silicon precursor such as silane, disilane, a chlorosilane in a reducing environment, or a combination, and others. Deposition temperature can range from about 250 Degree Celsius to about 490 Degree Celsius. In certain embodiment, deposition temperature ranges from about 350 Degree Celsius to about 440 Degree Celsius and no greater than about 450 Degree Celsius.

In some embodiments, the switching material is characterized by a state, for example, a resistance state dependent on an electric field in the switching material. In a specific embodiment, the switching material is an amorphous silicon material. The amorphous silicon material has essentially intrinsic semiconductor characteristic and is not intentionally doped in a specific embodiment. In various embodiments, the amorphous silicon is also referred to as non-crystalline silicon (nc-Si). nc-Si non-volatile resistive switching devices may be fabricated using existing CMOS technologies. In an exemplary process, a mixture of silane (SiH4)(45 sccm) and Helium (He) (500 sccm) is used to form an a-Si layer with a deposition rate of 80 nm per minute (T=260° C., P=600 mTorr) during PECVD. In another exemplary process, a mixture of silane (SiH4)(190 sccm) and Helium (He) (100 sccm) is used to form an a-Si layer with a deposition rate of 2.8 A per second (T=380° C., P=2.2 Torr) during PECVD. In another exemplary process, silane (SiH4 80 sccm) or disilane is used to form an a-Si layer with a deposition rate of 2.8 nm per minute (T=585° C., P=100 mTorr) during LPCVD. Portions of poly-silicon grains may form during the LPCVD process and result in an amorphous-poly silicon film. In various embodiments, no p-type, n-type, or metallic impurities are intentionally added to the deposition chamber while forming the amorphous silicon material. Accordingly, when deposited, the amorphous silicon material is substantially free of any p-type, n-type or metallic dopants, i.e. the amorphous silicon material is undoped.

Figure 8:
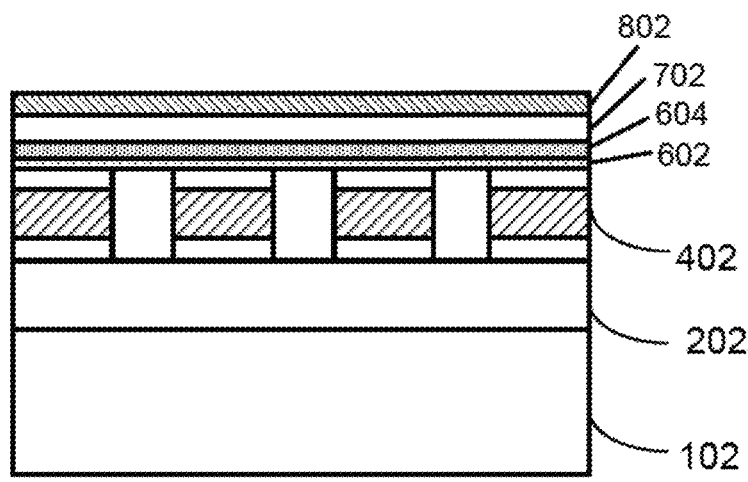

Referring to FIG. 8, the method includes forming an active conductive material 802 overlying the resistive switching material. The active conductive material can be silver, gold, palladium, platinum, zinc, aluminum, and a combination, and others. The active conductive material is characterized by a suitable diffusivity in the amorphous silicon material upon application of an electric field. For amorphous silicon material as the resistive switching material, the active conductive material can be silver, an alloy of silver, or a metal stack which at least contains silver is configured to be in direct contact with the resistive switching material, depending on the application.

In some embodiments, the active conductive silver material is in direct contact with the amorphous silicon used as the resistive switching material in a specific embodiment. In other embodiments, a thin layer of material, e.g. oxide, nitride, is formed prior to the deposition of the silver material on top of the amorphous silicon used as the resistive switching material. This interposing thin layer of material may be naturally or specifically grown or formed. In some embodiments, one or more etch operations (e.g. HF etch, Argon etch) may help control the thickness of this layer. In some embodiments, the thickness of the material (e.g. oxide) prior to deposition of the silver material may range from about 20 angstroms to about 50 angstroms; in other embodiments, the thickness may range from about 30 angstroms to about 40 angstroms; or the like. In some embodiments, an additional layer of amorphous silicon may be disposed upon the top of the thin layer of (oxide, nitride, barrier) material, prior to deposition of the silver material. This additional layer of amorphous silicon (not intentionally doped) may be used to help bind the silver material to the thin layer of material (e.g. oxide, nitride, barrier). In some examples, the thickness may be on the order of 20-50 angstroms. In one example, the order of layers may be: undoped amorphous silicon used as the resistive switching material, a thin layer of material (e.g. oxide, nitride, barrier), a thin layer of amorphous silicon, and the silver material.

Taking again the amorphous silicon as the resistive switching material as an example. The silver material forms a silver region in a portion of the amorphous silicon material upon application of the electric filed. The silver region comprises a plurality of silver particles, including silver ions, silver clusters, silver atoms and a combination. The plurality of silver particles is formed in defect sites of the amorphous silicon material in a specific embodiment. The silver region further comprises a silver filament structure extending towards the first wiring structure. The filament structure is characterized by a length, a distance between the silver particles, and a distance between the filament structure and the first electrode structure, or the p+ polycrystalline silicon material of the buffer layer. In a specific embodiment, the resistive switching material (for example, the amorphous silicon material) is characterized by a resistance depending at least on a length, a distance between the silver particles, and a distance between the filament structure and the first electrode structure. Due to material mismatch, defect density is high at an interface region formed from the amorphous silicon material and the first wiring material, and may cause a short. The buffer layer (for example, the p+ polycrystalline silicon material formed overlying the p+ polycrystalline silicon germanium material) controls an interfacial defect density and a band gap mismatch between the amorphous silicon material and the first wiring structure for proper switching behavior of the resistive switching device in a specific embodiment.

In various embodiments, the p+ polycrystalline silicon and the p+ polycrystalline silicon germanium material further provide a suitable work function and a barrier height for the silver material to be driven towards the first electrode under a forward bias voltage. The distance between the silver particles and the first electrode can also be maintained for a suitable on-state current and provide endurance for the device. For example, the work function of p+ polysilicon material is about 5.15 eV for a barrier height of about 1.2 eV resulting in a programming voltage of less than about 5.0 eV and an endurance of greater than about $10^4$ on-off cycles. A low on state current ranging from about 100 nA to about 1 mA can be achieved depending on the deposition conditions for the amorphous silicon, resulting in a low leakage cell. However, as described, a metal material though having a similar work function as the p+ polycrystalline silicon would result in high on state current (greater than about 100 uA absent of a current compliance) or even shorts due to high defect density at the interface. Buffer material having a low work function would cause, for example, a polycrystalline or crystalline silicon material having an n type impurity characteristic (work function of about 4.05 eV) would cause the energy level of the amorphous silicon switching material to bend upwards and towards the direction that repel the metal particles from the interface region. This results in a high threshold voltage (greater than about 10 volts) for filament formation or programming. Of course one skilled in the art would recognize other modifications, variations, and alternatives.

Figure 9:
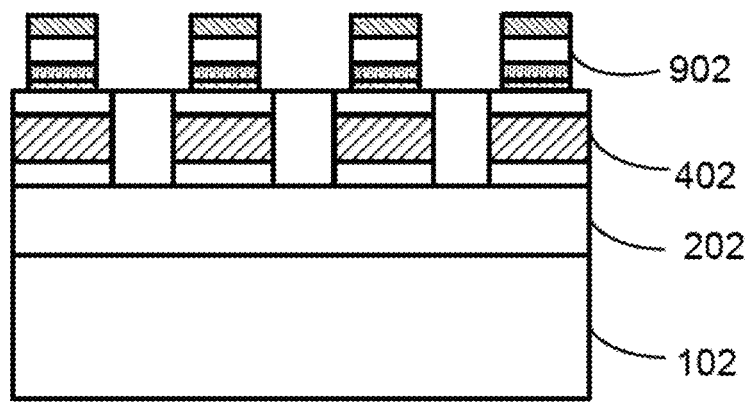
Figure 10:
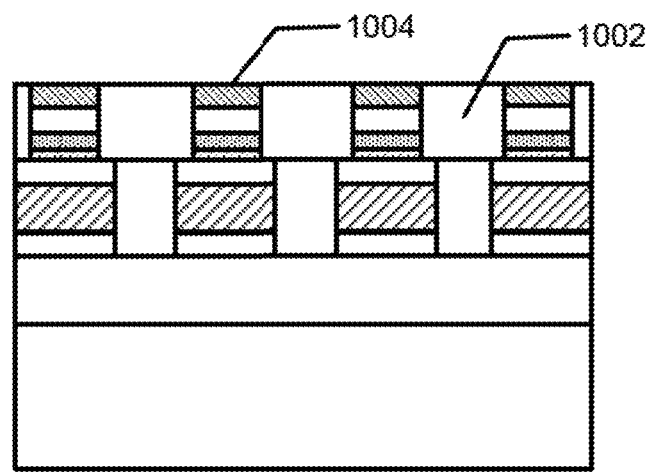

Depending on the application, various device structures can be formed. For example, as shown in FIG. 9, a stack of material including the buffer layer, the resistive switching material, and the active conductive material can be subjected to a pattern and etch process to form one or more pillar structures 902 overlying a respective first wiring structure. A second dielectric material can be formed overlying each of the one or more pillar structures and filling a gap between each of the one or more pillar structures. The second dielectric material can be subjected to a planarizing process to expose a top surface region of each of the one or more pillar structures as shown in FIG. 10. The planarizing process can be a chemical mechanical polishing process. Alternatively, an etch back process or a combination of chemical mechanical polishing process and the etch back process may be used depending on the embodiment.

Figure 11:
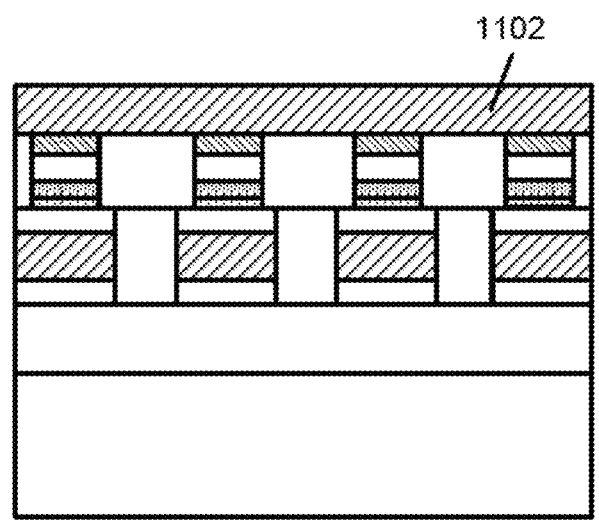

As shown in FIG. 11, a second wiring material 1102 can be formed overlying each of the pillar structures and the planarized second dielectric material. The second wiring material is subjected to a pattern and etch process to form a second wiring structure overlying the active conductive material. In a specific embodiment, the first wiring structure can be elongated and configured to extend in a first direction. The second wiring structure is elongated in shape and configured to extend in a second direction. The first direction and the second direction can be configured to be orthogonal to each other in a specific embodiment.

Alternatively, the resistive switching material can be a metal oxide material. In a specific embodiment, the metal oxide material can be a zinc oxide material formed overlying the buffer layer material. As described, the buffer layer material comprises the polycrystalline silicon material having the p+ type impurity characteristic formed overlying a polycrystalline silicon germanium material having the p+ type impurity characteristic in a specific embodiment. For zinc oxide as the resistive switching material, the active conductive material can be an aluminum doped zinc oxide material in a specific embodiment.

Accordingly, embodiments according to the present invention provide a method and device structure to form a resistive switching device for a non-volatile memory device. The method provides a buffer layer between the active metal filament structure in the resistive switching material and an electrode (for example, a metal electrode) for proper operation of the resistive switching device. The buffer layer material is characterized by a suitable bandgap, electrical conductivity, work function, and a material matching between the electrode material and the resistive switching material. The buffer layer material is further characterized by a deposition temperature no greater than about 450 Degree Celsius well suitable to be formed in a back end of CMOS process. The dopant species (for example, the boron species) are activated during deposition without an anneal process in a specific embodiment. Depending on the application, the resistive switching device can be configured in a 1 TnR approach, or n resistive switching devices controlled by one transistor device or a crossbar configuration. One skilled in the art would recognize the variations, modifications, and alternatives.

The performance (for example, endurance, retention, leakage, and switching speed, among others) of the resistive switching device can be further enhanced by providing means for controlling the filament structure. For example, the active conductive material can be configured in a via structure overlying the resistive switching material. The via structure can be formed in a portion of a suitable dielectric material overlying at least the resistive switching material. The active conductive material is in physical and electrical contact with the resistive switching material in a specific embodiment.

Figure 12:
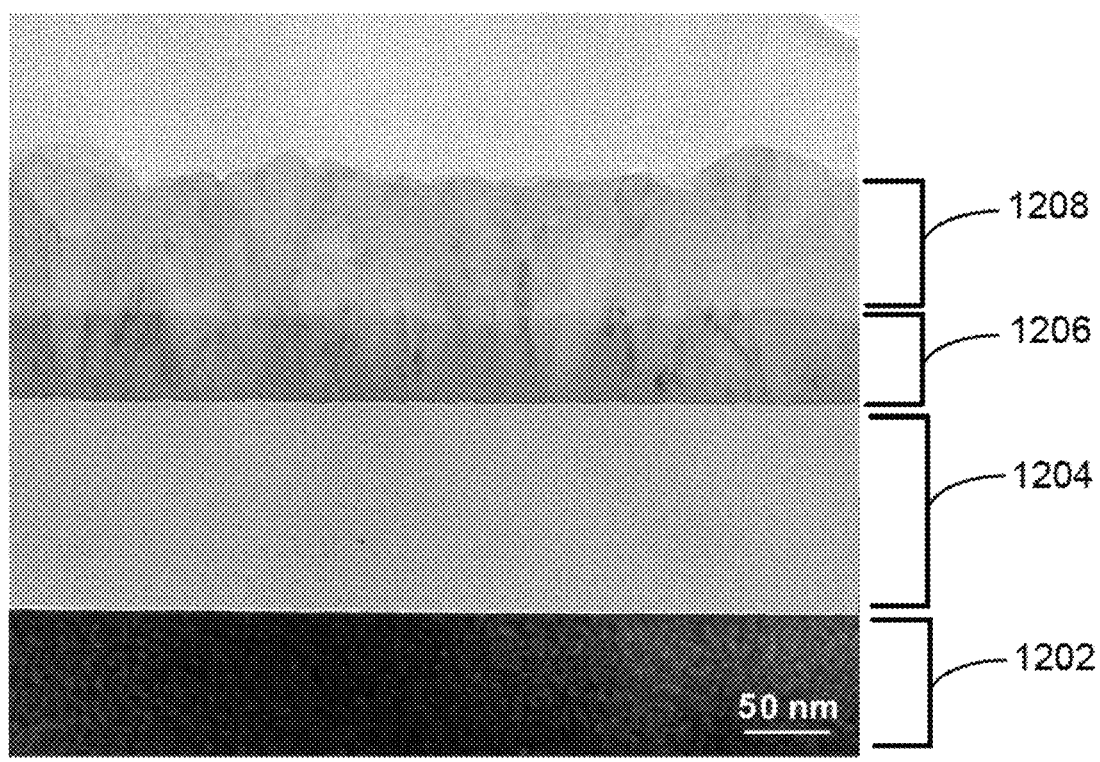
FIG. 12 is a scanning electron microscope image of a buffer layer for the resistive switching device according to an embodiment of the present invention.

FIG. 12 is a scanning electron microscope image of the buffer layer according to an embodiment of the present invention, in which the buffer layer comprises multiple silicon-bearing materials. As shown, a silicon substrate 1202 was provided. A silicon oxide material 1204 was formed overlying the silicon substrate. A p+polycrystalline silicon germanium material 1206 formed overlying silicon oxide material 1204 and a p+polycrystalline silicon material 1208 formed overlying the p+polycrystalline silicon germanium material 1206. P+polycrystalline silicon germanium material 1206 and p+polycrystalline silicon germanium material 1208 were deposited using the following parameters:

P+ polycrystalline silicon germanium deposition:
Nucleation: 5 mins, 450° C., 300 mTorr, 200 sccm SiH4
Main: 25 mins, 450° C., 400 mTorr, 170 sccm SiH4, 15 sccm GeH4, 15 sccm BCl3
P+ polycrystalline silicon deposition:
40 mins, 450° C., 400 mTorr, 185 sccm SiH4, 15 sccm BCl3

The above process parameters are merely an example, other modifications, variations and alternatives exist and would be recognized by one skilled in the art. As shown, the buffer material comprised of p+ polycrystalline silicon material 1208 overlying p+ polycrystalline silicon germanium material 1206 and was deposited overlying a silicon oxide material. Both p+ polycrystalline silicon material 1208 and p+ polycrystalline silicon germanium material 1206 are substantially crystalline and provide a desirable electric conductivity characteristic. The p+ polycrystalline silicon germanium material has a measured sheet resistance of about 0.004 Ohm-cm. Depending on a thickness deposited, the p+ polycrystalline silicon material can have an amorphous silicon material formed on top. It is therefore desirable to control the p+ polycrystalline silicon material to have a thickness of no greater than about 30~50 nanometers.

Figure 13:
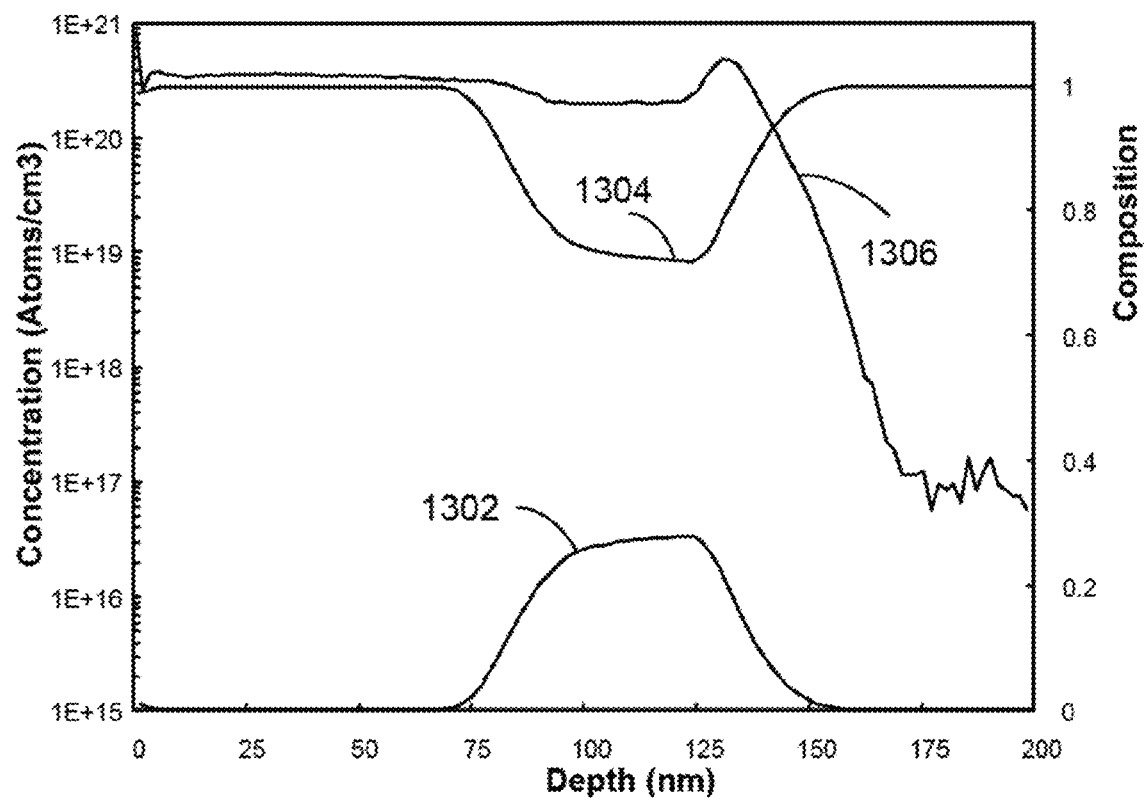
FIG. 13 is a secondary ion mass spectrometry plot of the buffer layer according to an embodiment of the present invention.

FIG. 13 is a secondary ion mass spectrometry of the buffer layer materials according to an embodiment of the present invention (for example as in FIG. 12). As shown, a plot of composition (right vertical axis) as well as concentration of the constituents (left vertical axis) as a function of depth (horizontal axis) is shown. Curve 1302 is a plot of germanium concentration as a function of depth. Curve 1304 is a plot of silicon concentration as a function of depth and curve 1306 is a plot of boron concentration as a function of depth. The silicon germanium material occurred at a depth of 75 nm from the surface. The boron concentration is about 3E20 atoms per $cm^3$ in p+ silicon material and 2E20 atoms per $cm^3$ p+ polycrystalline silicon germanium material.

Figure 14:
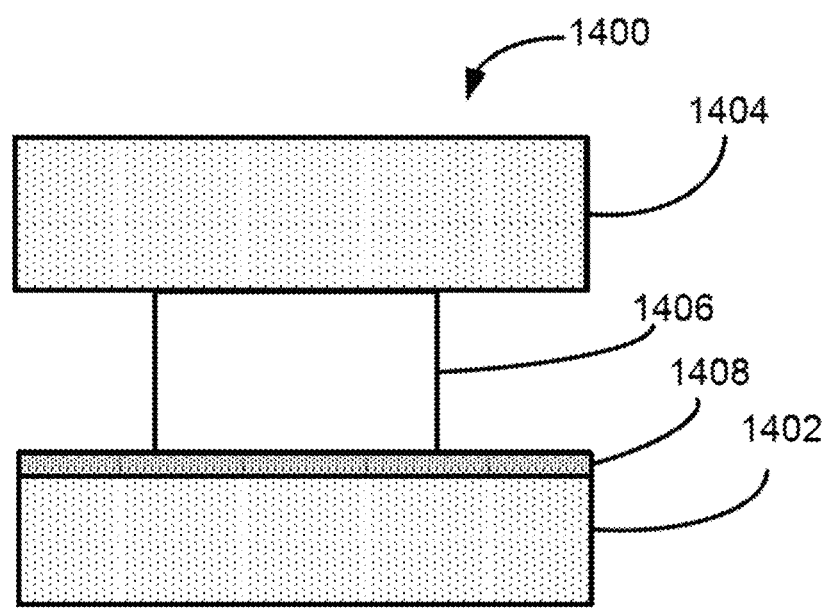
FIG. 14 is a simplified diagram illustrating a resistive switching device for a non-volatile memory device according to an embodiment of the present invention.

In a specific embodiment, a resistive switching device 1400 for a memory device is provided as shown in FIG. 14. The resistive switching device includes a first electrode 1402, a second electrode 1404, and a resistive switching material 1406 configured in an intersection region between the first electrode and the second electrode. Second electrode 1404 includes at least an active conductive material and the resistive switching material is configured to be in physical and electrical contact with the active conductive material. In a specific embodiment, a buffer layer material 1408 comprising one or more silicon material having a p+ impurity characteristic is disposed in between the first electrode and the resistive switching material. Depending on the application, the first electrode and the second electrode can each include a wring structure using metal material selected from silver, copper, tungsten, aluminum, or a combination. In other embodiments, the wiring structure for each of the first electrode and the second electrode can be a doped semiconductor material.

Referring to FIG. 14, resistive switching material 1406 can include a silicon material having an intrinsic semiconductor characteristic. In a specific embodiment, the silicon material can be an amorphous silicon material or an amorphous silicon germanium material having an intrinsic semiconductor characteristic. In other embodiments, resistive switching material 1406 can include a metal oxide material such as a zinc oxide material.

Figure 15:
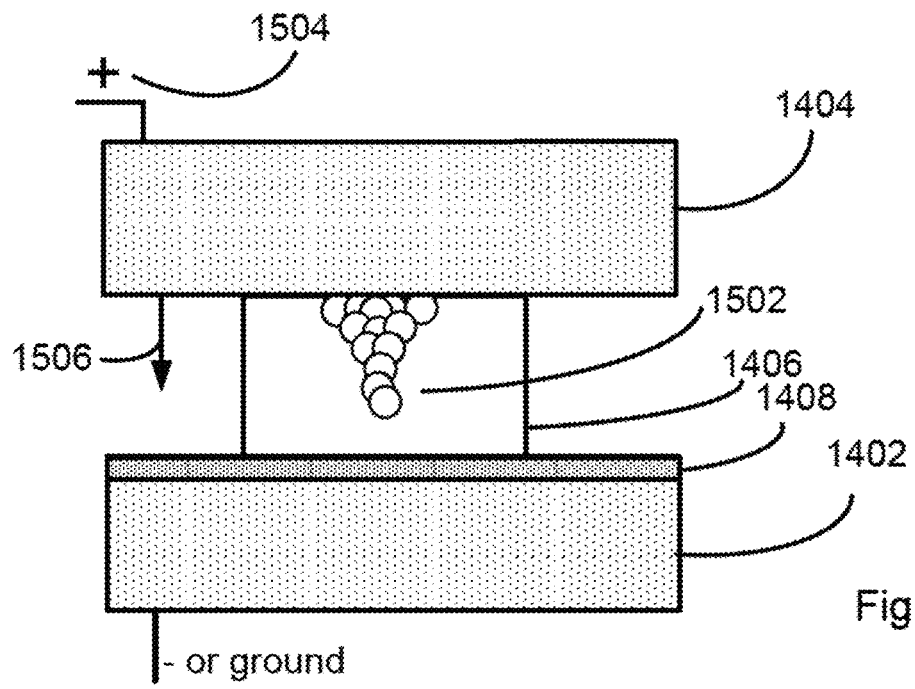
FIGS. 15-16 are simplified diagrams illustrating operations of the resistive switching device for a non-volatile memory device according to an embodiment of the present invention.

Referring to FIG. 15, the active conductive material forms a conductive material region 1502 in a portion of the resistive switching material upon application of a forward bias voltage or programming voltage 1504. The forward bias voltage is a positive voltage applied to second electrode 1404 with respect to the first electrode 1402 for amorphous silicon switching material and silver as the active conductive material. As shown, active material region further includes a filament structure configured to extend 1506 towards first electrode 1402 upon application of the forward bias voltage. Buffer material 1408 is characterized by a work function, bandgap, and electrical conductivity such that a suitable energy barrier exists between the filament structure and the buffer material for a controllable on-state current absent of a current compliance upon application of a programming voltage. In a specific embodiment buffer material 1408 can include a polycrystalline p+ silicon germanium material or a polycrystalline p+ silicon material, or a combination. In a specific embodiment, buffer material 1408 includes a p+ polycrystalline silicon material overlying a p+ polycrystalline silicon germanium material and the resistive switching material is in physical and electric contact with the p+ polycrystalline silicon material. As noted, p+ polycrystalline silicon material has a work function of about 5.15 eV particular suited for amorphous silicon material as the resistive switching material and silver as the active conductive material, for proper switching and desirable on state current, and endurance of the device. Additionally, the desirable on-state current is controllable in absence of a current compliance. As merely an example, the on state current can range from about 100 nA to no greater than 1 mA depending on device feature size and deposition condition of the amorphous silicon material.

Figure 16:
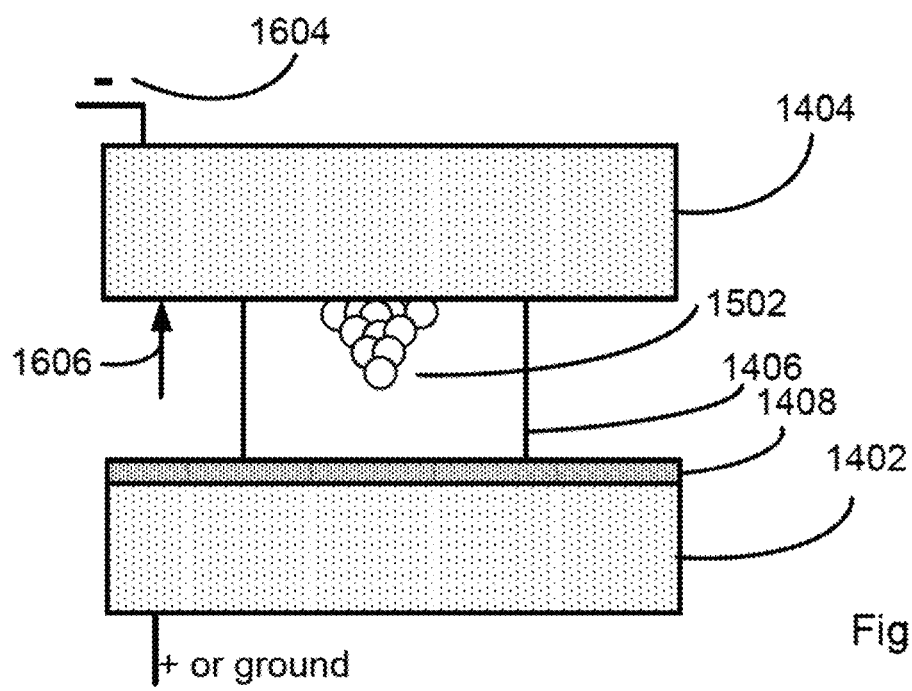

As illustrated in FIG. 16, when a reverse bias voltage 1604 is applied to the second electrode after programming, filament structure 1502 retracts 1606 and the resistive switching device is in a high resistance state or an off state. The buffer material allows the filament structure to extend upon application of the forward bias voltage for programming and to retract upon application of the reverse bias voltage after programming. Endurance of the resistive switching device can be greater than $10^4$ cycles, well suited for a non-volatile memory device. Of course, one skilled in the art would recognize other variations, modifications, and alternatives.

Though the present invention has been exemplified in various embodiments, it is to be understood that the examples and embodiment described herein are for illustrative purpose only and that various modifications or alternatives in light thereof will be suggested to persons skilled in the art and are to be included within the spirit and purview of this application and scope of the appended claims.

What is claimed is:

1. A memory device, comprising:
a first electrode;
a second electrode having a portion comprising an active conductive material;
a resistive switching material configured in an intersection region between the first electrode and the second electrode; and
a buffer layer material that has a p+ impurity characteristic disposed in between the first electrode and the resistive switching material, wherein the buffer layer material comprises a polycrystalline p+ silicon germanium material and a polycrystalline p+ silicon material.

2. The device of claim 1 wherein the second electrode comprises a metal material selected from a group consisting of: silver, copper, tungsten, aluminum, or a combination.

3. The device of claim 1 wherein the resistive switching material comprises a silicon material having an intrinsic semiconductor characteristic.

4. The device of claim 3 wherein the silicon material having the intrinsic semiconductor characteristic comprises an amorphous silicon material or an amorphous silicon germanium material.

5. The device of claim 1 wherein the resistive switching material comprises a zinc oxide material.

6. The device of claim 1 wherein the buffer layer material is characterized by a work function and barrier height that results in an energy barrier between active conductive material particles in the resistive switching layer and the buffer layer material.

7. The device of claim 6 wherein the energy barrier facilitates an intrinsically controllable on-state current magnitude independent of current compliance circuitry, in response to application of a first voltage.

8. The device of claim 7 wherein the first voltage is a forward bias voltage comprising of a positive voltage applied to the second electrode with respect to the first electrode upon programming to cause a filament structure derived from the active conductor material to form in a portion of the resistive switching material.

9. The device of claim 8 wherein the filament structure is configured to retract upon application of a backward bias voltage comprising of a negative voltage applied to the second electrode with respect to the first electrode after programming.

10. The device of claim 1, wherein the polycrystalline p+ silicon material has a thickness within a range of about 30 nanometers (nm) to about 50 nm.

11. The device of claim 1, wherein the buffer layer material comprises a first silicon-bearing layer formed of the polycrystalline p+ silicon germanium material underlying a second silicon-bearing layer formed of the polycrystalline p+ silicon material.

12. The device of claim 11, wherein the first silicon-bearing layer formed of polycrystalline p+ silicon germanium material has a dopant concentration between about 1E20 and about 3E20 particles per $cm^3$.

13. The device of claim 11, wherein the second silicon-bearing layer formed of polycrystalline p+ silicon material has a dopant concentration between about 2E20 and about 4E20 particles per $cm^3$.

14. A memory device, comprising:
a substrate having a top surface;
an insulator layer overlying the top surface of the substrate;
a first wiring structure within or overlying the insulator layer and extending along a first direction;
a buffer layer comprising at least two silicon-bearing sub-layers, wherein the buffer layer has a p+ impurity characteristic and each of the at least two silicon-bearing sub-layers have a p+ impurity characteristic;
a resistive switching layer overlying the buffer layer; and
a second wiring structure overlying the resistive switching layer and extending along a second direction that is not parallel with the first direction.

15. The device of claim 14, wherein the at least two silicon-bearing sub-layers comprise a polycrystalline p+ silicon material sub-layer and a polycrystalline p+ silicon germanium material sub-layer.

16. The device of claim 15, wherein the polycrystalline p+ silicon material sub-layer is overlying the polycrystalline p+ silicon germanium material sub-layer.

17. The device of claim 15, wherein the polycrystalline p+ silicon germanium material sub-layer has a composition of between about 0.2 and about 0.3 parts germanium.

18. The device of claim 14, wherein the second wiring structure further comprises an active conductive material in electrical contact with the resistive switching material and with the second wiring structure.

19. The device of claim 18, further comprising:
a dielectric material overlying the resistive switching material; and
a via structure formed in a portion of the dielectric material overlying the resistive switching material, wherein the active conductive material is situated at least in part within the via structure and facilitates ohmic contact between the resistive switching material and the second electrode.

20. The device of claim 18, wherein the buffer layer is characterized by a work function and barrier height that results in an energy barrier between particles of the active conductive material in the resistive switching layer and the buffer layer material.

* * * * *